United States Patent
Okunishi

(10) Patent No.: US 10,332,728 B2
(45) Date of Patent: Jun. 25, 2019

(54) PLASMA PROCESSING APPARATUS

(71) Applicant: Tokyo Electron Limited, Tokyo (JP)

(72) Inventor: Naohiko Okunishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1370 days.

(21) Appl. No.: 14/057,100

(22) Filed: Oct. 18, 2013

(65) Prior Publication Data

US 2014/0110061 A1 Apr. 24, 2014

Related U.S. Application Data

(60) Provisional application No. 61/719,567, filed on Oct. 29, 2012.

(30) Foreign Application Priority Data

Oct. 19, 2012 (JP) .................................. 2012-231551
May 21, 2013 (JP) .................................. 2013-107194

(51) Int. Cl.
| | |
|---|---|
| H05H 1/46 | (2006.01) |
| H01J 37/32 | (2006.01) |
| H01L 21/67 | (2006.01) |
| H01L 21/683 | (2006.01) |

(52) U.S. Cl.
CPC .. *H01J 37/32522* (2013.01); *H01J 37/32091* (2013.01); *H01L 21/67103* (2013.01); *H01L 21/6831* (2013.01); *H05H 1/46* (2013.01); *H05H 2001/4682* (2013.01)

(58) Field of Classification Search
CPC ............ C23C 16/4586; H01J 37/32091; H01J 37/32522; H01J 37/32715; H01J 37/32724; H01L 21/67103; H01L 21/6831; H05H 1/46; H05H 2001/4682
See application file for complete search history.

(56) References Cited

U.S. PATENT DOCUMENTS 5,250,137 A * 10/1993 Aranni ................ H01L 21/6831
118/723 I
2002/0002947 A1 * 1/2002 Satoyoshi ............. H01J 37/321
118/723 I (Continued)

FOREIGN PATENT DOCUMENTS

| JP | 07-221033 A | 8/1995 |
|---|---|---|
| JP | 07221033 A * | 8/1995 |

(Continued)

*Primary Examiner* — Benjamin Kendall
(74) *Attorney, Agent, or Firm* — Pearne & Gordon LLP

(57) ABSTRACT

In a plasma processing apparatus, a heating element 50 provided in a susceptor 12 is electrically connected to a heater power supply 58 disposed at an outside of a chamber 10 via an internal conductor 51 provided through the susceptor 12, a power feed conductor 52 provided across a space SP, a filter unit 54 and an electric cable 56. A casing 110 of the filter unit 54 is vertically fastened, from a bottom of the chamber 10, to an opening 114 formed in a bottom wall (base) 10a of the chamber 10 to be adjacent to a cylindrical conductive cover 42 that surrounds a power feed rod 40. The casing 110 is physically or electrically coupled to the bottom wall 10a of the chamber 10.

19 Claims, 24 Drawing Sheets

(56) References Cited

U.S. PATENT DOCUMENTS

| | | | | |
|---|---|---|---|---|
| 2007/0044916 A1* | 3/2007 | Isozaki | ............ | C23C 4/02 |
| | | | | 156/345.52 |
| 2009/0178764 A1* | 7/2009 | Kanno | ............ | H01L 21/67103 |
| | | | | 156/345.52 |
| 2011/0024048 A1* | 2/2011 | Nakamura | ........ | H01J 37/32091 |
| | | | | 156/345.51 |
| 2011/0222038 A1* | 9/2011 | Yamashita | .......... | C23C 16/4581 |
| | | | | 355/53 |
| 2012/0032756 A1* | 2/2012 | Long | ................ | H01J 37/32174 |
| | | | | 333/181 |

FOREIGN PATENT DOCUMENTS

| | | |
|---|---|---|
| JP | 08-264465 A | 10/1996 |
| JP | 2008-198902 A | 8/2008 |
| JP | 2011-135052 A | 7/2011 |

* cited by examiner

PLASMA PROCESSING APPARATUS

CROSS-REFERENCE TO RELATED APPLICATION

This application claims the benefit of Japanese Patent Application Nos. 2012-231551 and 2013-107194 filed on Oct. 19, 2012, and May 21, 2013, respectively, and U.S. Provisional Application Ser. No. 61/719,567 filed on Oct. 29, 2012, the entire disclosures of which are incorporated herein by reference.

TECHNICAL FIELD

The embodiments described herein pertain generally to a plasma processing apparatus configured to perform a plasma process on a processing target substrate by using a high frequency power; and, more particularly, pertain to a plasma processing apparatus having a filter configured to block a high frequency noise introduced into a heater power feed line through a high frequency electrode and a heating element incorporated in a mounting table configured to mount thereon a processing target substrate in a processing vessel.

BACKGROUND

In microprocessing for manufacturing a semiconductor device or a FPD (Flat Panel Display) using plasma, it is very important to control a temperature or a temperature distribution of a processing target substrate (a semiconductor wafer, a glass substrate, etc.) as well as to control a plasma density distribution on the processing target substrate. If the temperature control of the substrate is not performed appropriately, uniformity of process characteristics as well as substrate surface reaction may not be achieved. As a result, a decrease of a production yield of semiconductor devices or display devices may occur.

In general, a mounting table or susceptor, which mounts thereon a processing target substrate within a vessel of a plasma processing apparatus (particularly, a capacitively coupled plasma processing apparatus), has a function as a high frequency electrode that applies a high frequency power into a plasma space, a function as a holder that holds thereon the substrate by electrostatic attraction or the like; and a function as a temperature controller that controls the temperature of the substrate to a certain temperature by heat transfer. As for the temperature control function, it is required to appropriately correct a heat transfer characteristic distribution of the substrate affected by non-uniform radiant heat from plasma or a vessel wall, or a heat distribution affected by a substrate supporting structure.

Conventionally, in order to control the temperature of the susceptor or the substrate, a heater structure is widely employed. In this structure, a heating element configured to generate heat by applying an electric current is provided in the susceptor, and Joule heat generated by the heating element is controlled. When using such a heater structure, however, a part of a high frequency power applied to the high frequency electrode of the susceptor from a high frequency power supply might be easily introduced into a heater power feed line through the heating element. If a high frequency noise reaches a heater power supply through the heater power feed line, operation or performance of the heater power supply might be deteriorated. Further, if a high frequency current flows in the heater power feed line, the high frequency power would be wasted. Typically, to solve these problems, a filter configured to attenuate or block the high frequency noise flowing from the heating element embedded in the susceptor is provided on the heater power feed line.

The present applicant describes, in Patent Document 1, a plasma processing apparatus in which an air core coil having large inductance is provided at an upstream end of such kind of filter, and the air core coil is accommodated in a conductive casing provided at the vicinity of (typically, below) a susceptor. In this plasma processing apparatus, when a single high frequency power equal to or lower than about 13.56 MHz is applied to a high frequency electrode within the susceptor, the filter with the air core coil configured as mentioned above may be operated effectively. Accordingly, while allowing a large amount of a heater current equal to or larger than about 30 A to flow in a heater power feed line, a high frequency noise equal to or lower than about 13.56 MHz can be blocked effectively, securely and stably.

Further, the present applicant also describes, in Patent Document 2, a technique for improving the performance of a filter configured to block a high frequency noise having a high frequency that flows into a heater power feed line from a susceptor within a processing vessel of a plasma processing apparatus. This filter technique uses a regular multiple parallel resonance characteristic of a distributed constant line. Accordingly, even when a high frequency power having a high frequency (e.g., about 27 MHz) is applied to a high frequency electrode within the susceptor as well as in case that a high frequency power having a relatively low frequency is applied, the filter is capable of blocking the high frequency noise with only one air core coil, and, thus, the only one coil needs to be accommodated in a housing of the filter.

Patent Document 1: Japanese Patent Laid-open Publication No. 2008-198902

Patent Document 2: Japanese Patent Laid-open Publication No. 2011-135052

However, in the conventional plasma processing apparatus using the filter configured to block a high frequency noise introduced into the heater power feed line via the high frequency electrode and the heating element within the susceptor, a layout of the filter or an arrangement of the heater power feed line directly under the susceptor may have adverse influence on electron density distribution on the susceptor or in-plane uniformity of process characteristics as well as on a frequency-impedance characteristic of the filter.

SUMMARY

In view of the foregoing problems, example embodiments provide a plasma processing apparatus configured to reduce adverse influence on an electron density distribution on a mounting table or in-plane uniformity of process characteristics by providing a filter unit on a heater power feed line that electrically connects a heating element embedded in the mounting table within a processing vessel and a heater power supply disposed at an outside of the processing vessel, and also configured to obtain stable frequency-impedance characteristic in the filter unit.

In one example embodiment, a plasma processing apparatus includes a processing vessel in which a plasma process is performed; a mounting table disposed on a plate-shaped conductive base with a space therebetween within the processing vessel and configured to mount and hold thereon a processing target substrate; a high frequency electrode provided in the mounting table; a high frequency power feed unit configured to apply a high frequency power of a predetermined frequency to the high frequency electrode; a heating element provided in the mounting table; a heater power feed line configured to electrically connect the heating element to a heater power supply disposed at an outside of the processing vessel; and a filter unit having a coil configured to attenuate or block a high frequency noise introduced to the heater power feed line through the heating element, and a casing accommodating therein the coil. Further, the filter unit is placed such that an upper end of the casing is arranged at a position equal to or lower than a top surface of the base directly under the mounting table. Furthermore, an opening, through which the heater power feed line passes without being contacted thereto, is formed in the base. Moreover, the heater power feed line includes a pin-shaped or rod-shaped first conductor extended from a first terminal of the coil located inside or under the opening of the base to a bottom surface of the mounting table through the space.

In the configuration of the plasma processing apparatus, the filter unit is not disposed within a space directly under the mounting table. Since the casing of the filter unit is fastened to the opening of the base such that the upper end of the casing is arranged at a position equal to or lower than the top surface of the base directly under the mounting table, the coil accommodated in the casing is placed lower than the top surface of the base having a ground potential. Thus, the coil is electromagnetically shielded from the high frequency electrode by the base and is not projected to the plasma generating space, and the coil does not serve as a singularity that disturbs a plasma density distribution.

In accordance with the plasma processing apparatus having the above-described configuration and operation, by providing the filter unit on the heater power feed line that electrically connects the heating element embedded in the mounting table in the processing vessel and the heater power supply disposed at the outside of the processing vessel, influence on an electron density distribution on the mounting table or in-plane uniformity of process characteristics can be minimized. Further, a stable frequency-impedance characteristic can be obtained in the filter unit.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
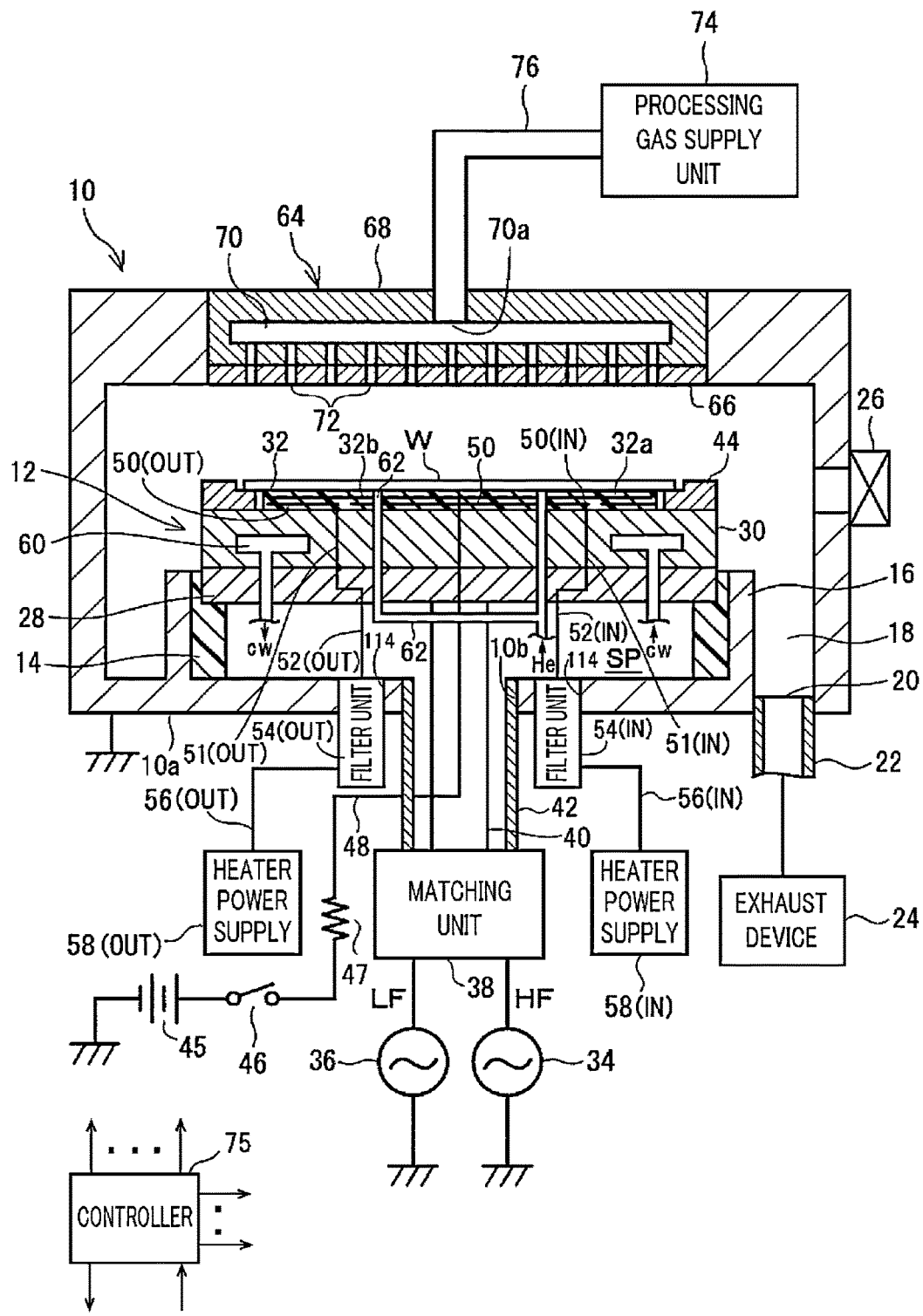
FIG. 1 is a cross sectional view illustrating a configuration of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

(Overall Configuration of Plasma Processing Apparatus)

FIG. 1 illustrates a configuration of a plasma processing apparatus in accordance with an example embodiment. The plasma processing apparatus is configured as a capacitively coupled plasma processing apparatus in which dual frequency powers are applied to a lower electrode. The plasma processing apparatus includes a cylindrical chamber (processing vessel) 10 made of, e.g., a metal such as aluminum or stainless steel, and the chamber 10 is grounded.

A circular plate-shaped mounting table or susceptor 12 configured to mount thereon a processing target substrate, e.g., a semiconductor wafer W is horizontally disposed in the chamber 10. The susceptor 12 is supported on a cylindrical supporting member 14 without being grounded. The cylindrical supporting member 14 is made of, a dielectric material such as ceramic and vertically extended upwards from a bottom of the chamber 10. A space SP communicating with the atmosphere space is formed among a bottom wall (in this example embodiment, a base) 10a, a bottom surface of the susceptor 12 and an inner wall of the dielectric cylindrical supporting member 14. The bottom surface of the susceptor 12 is a horizontal flat surface without having irregularities. A top surface of the bottom wall 10a of the chamber 10 is also formed as a horizontal flat surface without irregularities except for openings 10b and 114 which will be described later.

An annular exhaust path 18 is formed between an inner wall of the chamber 10 and a conductive cylindrical supporting member 16 vertically extended upwards from the bottom wall 10a of the chamber 10 along a periphery of the dielectric cylindrical supporting member 14. An exhaust opening 20 is formed in a bottom of the exhaust path 18, and an exhaust device 24 is connected to the exhaust opening 20 through an exhaust pipe 22. The exhaust device 24 includes a vacuum pump such as a turbo molecular pump and is capable of depressurizing a processing space within the chamber 10 to a required vacuum level. A gate valve 26 configured to open and close a loading/unloading opening for the semiconductor wafer W is provided to a sidewall of the chamber 10.

The susceptor 12 includes a backplate 28 made of a conductor such as aluminum, a lower high frequency electrode 30 made of a conductor such as aluminum, and an electrostatic chuck 32 configured to attract and hold a wafer, which are stacked in this order from below. The lower high frequency electrode 30 is electrically connected with a first high frequency power supply 34 and a second high frequency power supply 36 via a matching unit 38, a power feed rod 40 and the backplate 28.

The first high frequency power supply 34 outputs a first high frequency power HF of a certain frequency (typically, equal to or higher than, e.g., about 27 MHz, desirably, 60 MHz or higher) that mainly contributes to plasma generation. Meanwhile, the second high frequency power supply 36 outputs a second high frequency power LF of a certain frequency (typically, equal to or lower than, e.g., about 13 MHz) that mainly contributes to ion attraction into the semiconductor wafer W on the susceptor 12. The matching unit 38 accommodates a first matcher and a second matcher (not shown) configured to match impedance between the first and second high frequency power supplies 34 and 36 and a plasma load, respectively.

The power feed rod 40 is made of a cylindrical conductor having a certain outer diameter. An upper end of the power feed rod 40 is connected to a central portion of the bottom surface of the susceptor 12 (backplate 28), and a lower end of the power feed rod 40 is connected to high frequency output terminals of the first matcher and the second matcher within the matching unit 38. Further, a cylindrical conductive cover 42 surrounding the power feed rod 40 is provided between the bottom wall 10a of the chamber 10 and the matching unit 38. To elaborate, the circular opening 10b having a certain diameter larger than the outer diameter of the power feed rod 40 is formed in the bottom wall 10a of the chamber 10. An upper end of the conductive cover 42 is connected to the opening 10b while a lower end thereof is connected to ground (returning wire) terminals of the matchers.

The susceptor 12 has a diameter larger than that of the semiconductor wafer W. A top surface of the susceptor 12 is divided into a central region having a substantially same shape (circular shape) and a substantially same size as those of the wafer W, i.e., a wafer mounting portion; and an annular peripheral region extended outwards from the wafer mounting portion. The semiconductor wafer W as a processing target substrate is mounted on the wafer mounting portion. A ring-shaped plate member, a so-called focus ring 44, is mounted on the annular peripheral region. The focus ring 44 has an inner diameter larger than the diameter of the semiconductor wafer W and may be made of, by way of example, but not limitation, one of Si, SiC, C and $SiO_2$ depending on the material of the semiconductor wafer W to be etched.

In the electrostatic chuck 32 provided on the top surface of the susceptor 12, a DC electrode 32b is embedded within a dielectric layer 32a that is formed or fastened on a top surface of the high frequency electrode 30 as one body therewith. The DC electrode 32b is electrically connected with a DC power supply 45 provided at an outside of the chamber 10 via a switch 46, a resistor 47 having a high resistance value and a DC high voltage line 48. If a high DC voltage is applied to the DC electrode 32b from the DC power supply 45, the semiconductor wafer W can be attracted to and held on the electrostatic chuck 32 by an electrostatic force. The DC high voltage line 48 is a coated line and is connected to the DC electrode 32b of the electrostatic chuck 32 while penetrating the backplate 28 of the susceptor 12 and the lower high frequency electrode 30 from below after passing through an inside of the cylindrical power feed rod 40.

Figure 2:
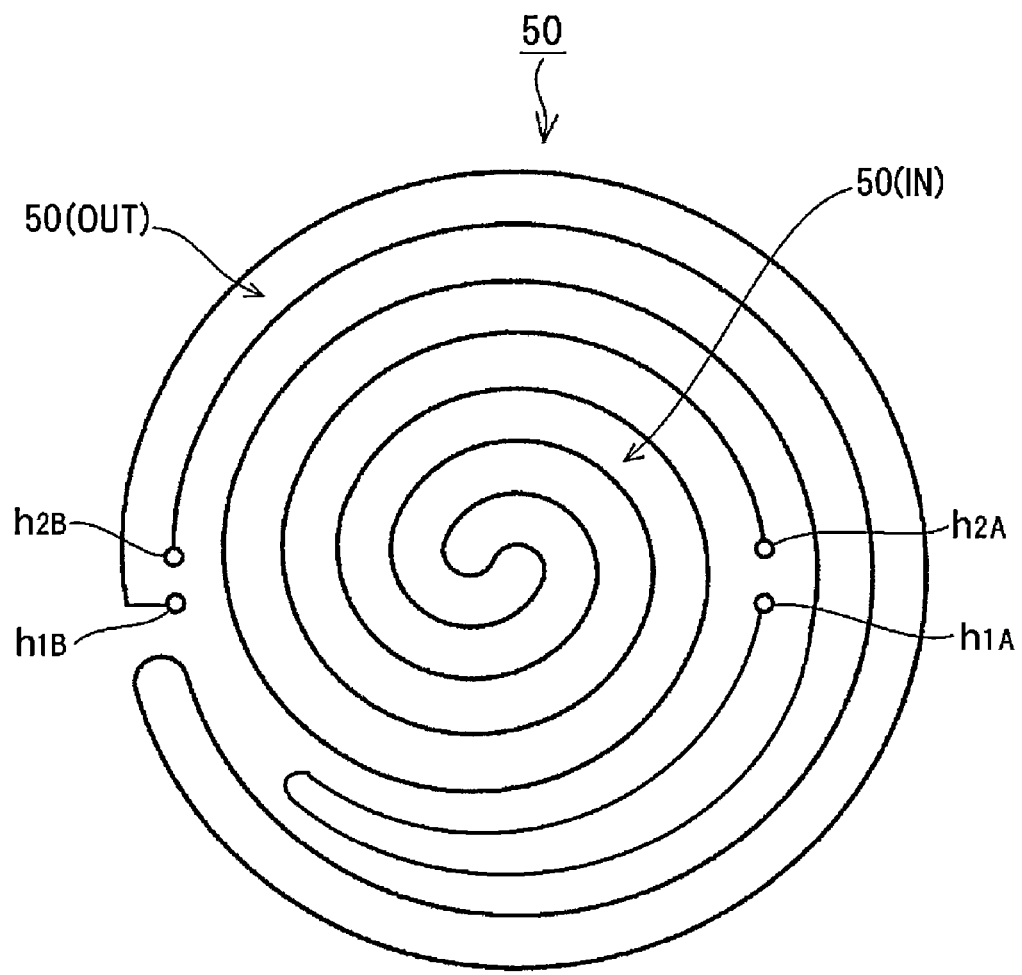
FIG. 2 is a schematic plane view illustrating a configuration of a heating element provided in a susceptor of the plasma processing apparatus.

A heating element 50 as well as the DC electrode 32b is also embedded in the dielectric layer 32a of the electrostatic chuck 32. The heating element 50 may be implemented by, but not limited to, a resistance heating wire having a spiral shape. In this example embodiment, this heating element 50 is divided in two parts in a radial direction of the susceptor 12: an inner heating wire 50(IN) and an outer heating wire 50(OUT), as depicted in FIG. 2.

The inner heating wire 50(IN) is electrically connected to an exclusive heater power supply 58(IN) provided at the outside of the chamber 10 via an internal conductor 51(IN) provided through the susceptor 12, a power feed conductor 52(IN) provided across the space SP, a filter unit 54(IN) and an electric cable 56(IN). The outer heating wire 50(OUT) is electrically connected to an exclusive heater power supply 58(OUT) provided at the outside of the chamber 10 via an internal conductor 51(OUT) provided through the susceptor 12, a power feed conductor 52(OUT) provided across the space SP, a filter unit 54(OUT) and an electric cable 56(OUT).

A layout of the filter units 54(IN) and 54(OUT) and an arrangement of the heater power feed line between the filter units 54(IN), 54(OUT) and the heating element 50 are primary features of the present example embodiment and will be described in detail later.

An annular coolant path 60 extended along, e.g., a circumferential direction is formed within the lower high frequency electrode 30 in the susceptor 12. A coolant of a preset temperature, e.g., cooling water cw is supplied into and circulated through the coolant path 60 via a coolant supply line 62 from a chiller unit (not shown). A temperature of the susceptor 12 can be reduced by adjusting the temperature of the coolant. Further, a heat transfer gas such as a He gas is supplied to an interface between the electrostatic chuck 32 and the semiconductor wafer W through the gas supply line 62 from a heat transfer gas supply unit (not shown) in order to thermally connect the semiconductor wafer W to the susceptor 12.

A shower head 64 serving as an upper electrode is provided at a ceiling of the chamber 10, facing the susceptor 12 in parallel. The shower head 64 includes an electrode plate 66 directly facing the susceptor 12; and an electrode supporting member 68 configured to support the electrode plate 66 from a backside thereof (from above it) in a detachable manner. A gas room 70 is formed within the electrode supporting member 68, and a multiple number of gas discharge holes 72 extended from the gas room 70 toward the susceptor 12 are formed through the electrode supporting member 68 and the electrode plate 66. A space between the electrode plate 66 and the susceptor 12 serves as a plasma generation space or a processing space. A gas supply line 76 led from a processing gas supply unit 74 is connected to a gas inlet opening 70a formed in a top portion of the gas room 70. The electrode plate 66 may be made of, by way of non-limiting example, but not limitation, Si, SiC or C, and the electrode supporting member 68 may be made of, by way of example, but not limitation, alumite-treated aluminum.

Operations of individual components of the plasma processing apparatus, e.g., the exhaust device 24, the high frequency power supplies 34 and 36, the switch 46 of the DC power supply 45, the heater power supplies 58(IN) and 58(OUT), the chiller unit (not shown), the heat transfer gas supply unit (not shown), the processing gas supply unit 74, and so forth and the overall operation (sequence) of the plasma processing apparatus are controlled by a controller 75 having a microcomputer.

In this plasma processing apparatus, in order to perform an etching process, for example, the gate valve 26 is first opened, and a semiconductor wafer W to be processed is loaded into the chamber 10 and mounted on the electrostatic chuck 32. Then, an etching gas (a single gas or a mixture gas) is introduced into the chamber 10 from the processing gas supply unit 74 at a certain flow rate, and an internal pressure of the chamber 10 is controlled to a preset value by the exhaust device 24. Further, the first and second high frequency power supplies 34 and 36 are powered on, and the first and second high frequency power supplies 34 and 36 output a first high frequency power HF and a second high frequency power LF at required power levels, respectively, and apply the high frequency powers HF and LF to the lower high frequency electrode 30 of the susceptor 12 via the matching unit 38 and the power feed rod 40. Further, the heat transfer gas (e.g., a He gas) is supplied to the interface between the electrostatic chuck 32 and the semiconductor wafer W from the heat transfer gas supply unit. Further, by turning on the switch 46 for the electrostatic chuck, the heat transfer gas is confined in the interface between the electrostatic chuck 32 and the semiconductor wafer W by an electrostatic attracting force. Meanwhile, by turning on the heater power supplies 58(IN) and 58(OUT), on the inner heating wire 50(IN) and the outer heating wire 50(OUT), Joule heats are generated, so that the temperature or a temperature distribution of the top surface of the susceptor 12 can be controlled to a preset value. The etching gas discharged from the shower head 64 is excited into plasma by a high frequency discharge in the plasma generation space between the susceptor 12 and the shower head 64. A processing target film on the surface of the wafer W is etched to have a required pattern by radicals or ions in the plasma.

In this capacitively coupled plasma processing apparatus, by applying the first high frequency power HF having a relatively high frequency (desirably, equal to or higher than, e.g., about 60 MHz) suitable for plasma generation to the lower high frequency electrode 30 within the susceptor 12, plasma can be highly densified in a desirably dissociated state. Accordingly, high-density plasma can be generated under a lower pressure condition. Further, by applying the second high frequency power LF having a relatively low frequency (equal to or lower than, e.g., about 13 MHz) suitable for ion attraction to the lower high frequency electrode 30, an anisotropic etching process having high selectivity can be performed on the semiconductor wafer W on the susceptor 12.

Moreover, in this capacitively coupled plasma processing apparatus, the susceptor 12 may be cooled by the chiller unit and heated by the heater at the same time, and the heating by the heater is controlled independently at the central region and the peripheral region of the susceptor 12 in the radial direction. Thus, the temperature can be changed and increased or decreased rapidly at a high speed, and profile of the temperature distribution can be controlled as required or in various ways.

(Circuit Configuration Within Filter Unit)

Now, a circuit configuration within the filter units 54(IN) and 54(OUT) in this plasma processing apparatus will be explained.

Figure 3:
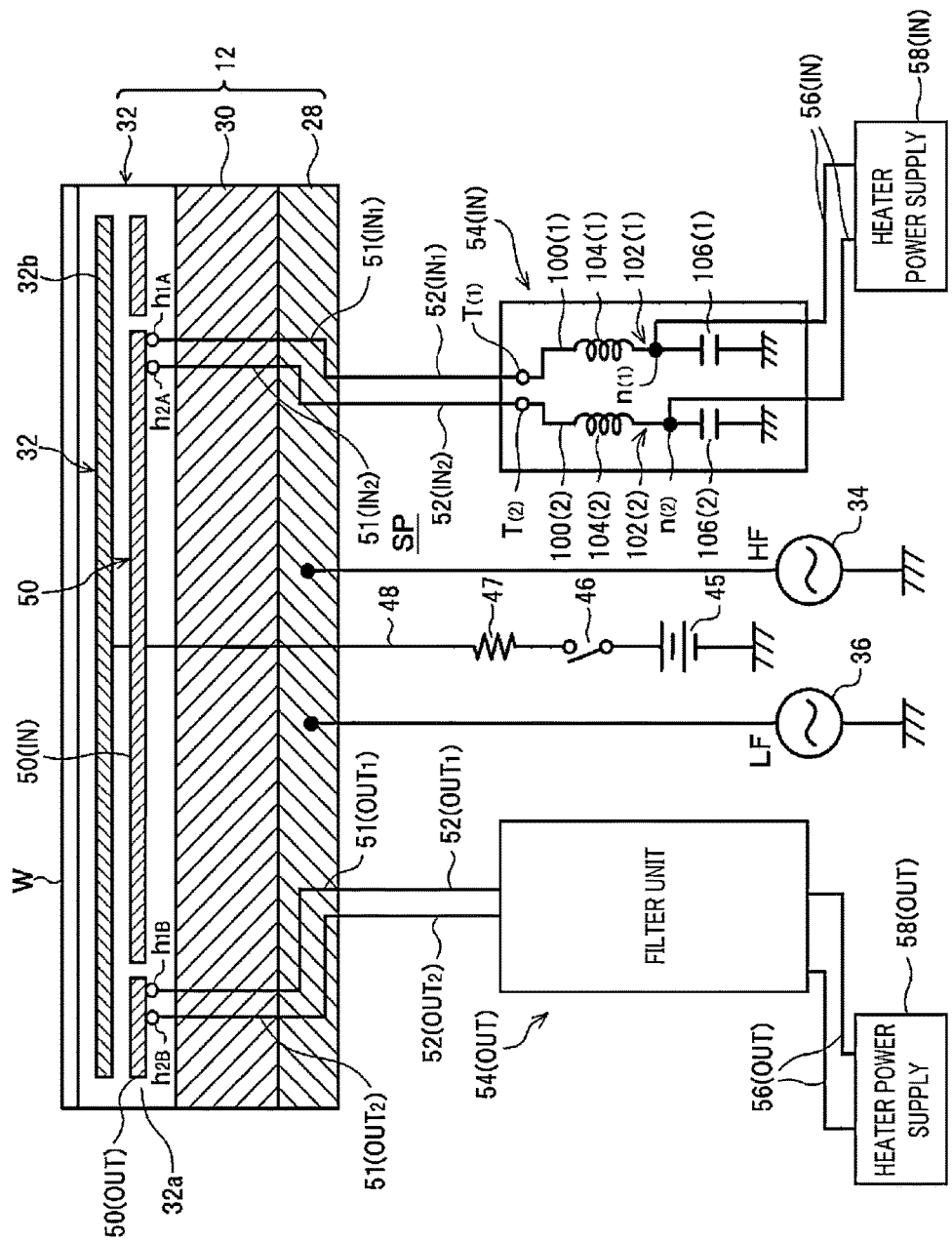
FIG. 3 is a diagram illustrating a circuit configuration of a heater power feed unit configured to supply power to the heating element within the susceptor.

FIG. 3 illustrates a circuit configuration of a heater power feed unit configured to apply a power to the heating element 50 provided in the susceptor 12 and configured to control a wafer temperature. In this example embodiment, heater power feed units having the substantially same circuit configurations are connected to the inner heating wire 50(IN) and the outer heating wire 50(OUT), respectively. With this configuration, heat generation rates or heat generation temperatures of the inner heating wire 50(IN) and the outer heating wire 50(OUT) can be controlled individually. In the following description, a configuration and an operation of the heater power feed unit for the inner heating wire 50(IN) will be elaborated. The heater power feed unit for the outer heating wire 50(OUT) has the completely same configuration and operation.

The heater power supply 58(IN) is an AC output power supply that performs a switching (ON/OFF) operation for, e.g., a commercial frequency by using, e.g., SSR (Solid-State Relay). The heater power supply 58(IN) is connected with the inner heating wire 50(IN) in a closed-loop circuit. To elaborate, between a pair of output terminals of the heater power supply 58(IN), a first output terminal is electrically connected to a first terminal $h_{1A}$ of the inner heating wire 50(IN) via a first heater power feed line 100(1), and a second output terminal is connected to a second terminal $h_{2A}$ of the inner heating wire 50(IN) via a second heater power feed line 100(2).

The filter unit 54(IN) includes a first filter 102(1) and a second filter 102(2) provided on the way of the first heater power feed line 100(1) and the second heater power feed line 100(2), respectively. These two filters 102(1) and 102(2) have the substantially same circuit configurations.

To be more specific, the filters 102(1) and 102(2) have single coils 104(1) and 104(2), respectively. Upper terminals (first terminals) or filter terminals $T_{(1)}$ and $T_{(2)}$ of the coils 104(1) and 104(2) are connected to the terminals $h_{1A}$ and $h_{2A}$ of the inner heating wire 50(IN) via a pair of power feed conductors $52(IN_1)$ and $52(IN_2)$ and a pair of internal conductors $51(IN_1)$ and $51(IN_2)$, respectively. Lower ends (second terminals) of the coils 104(1) and 104(2) are connected to a conductive member having a ground potential (e.g., the chamber 10) via capacitors 106(1) and 106(2), and also connected to the first output terminal and the second output terminal of the heater power supply 58(IN) via connection points $n_{(1)}$ and $n_{(2)}$ and the electric cable (pair cable) 56(IN), respectively.

In the heater power feed unit having the above-described configuration, during a cycle of positive polarity, an electric current outputted from the heater power supply 58(IN) may flow, from the one heating wire terminal $h_{1A}$ to the inner heating wire 50(IN) through the first heater power feed line 100(1), i.e., through the electric cable 56(IN), the coil 104(1), the power feed conductor $52(IN_1)$ and the internal conductor $51(IN_1)$, so that each part of the inner heating wire 50(IN) powered on thereby generates Joule heat. Then, after flowing from the other heating wire terminal $h_{2A}$, the electric current is returned back through the second heater power feed line 100(2), i.e., through the internal conductor $51(IN_2)$, the power feed conductor $52(IN_2)$, the coil 104(2) and the electric cable 56(IN). During a cycle of negative polarity, the electric current flows through the same circuit in the reverse direction to that stated above. Since the current of this heater AC output has a commercial frequency, impedance of the coils 104(1) and 104(2) or voltage drops thereof may be small to neglect, and the amount of a leakage current flowing to the earth through the capacitors 106(1) and 106(2) may be also small to neglect.

(Physical Structure and Layout of Filter Unit)

Figure 4:
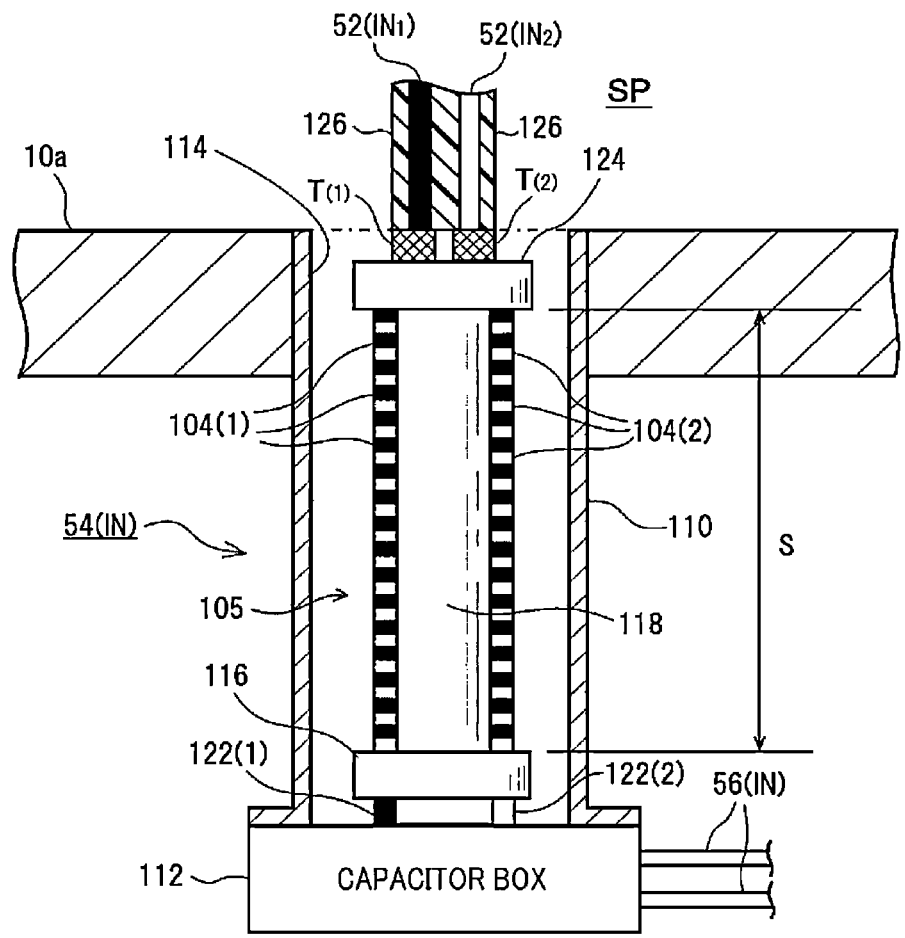
FIG. 4 is a cross sectional view illustrating a physical structure and a layout of a filter unit in accordance with the example embodiment.
Figure 5:
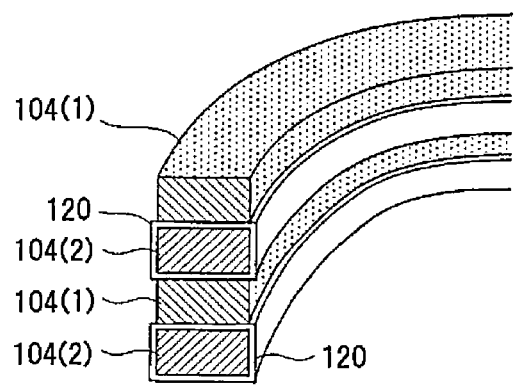
FIG. 5 is a perspective view illustrating a cross sectional perspective view of coil winding structure of air core coils provided on a common rod shaft in the filter unit.
Figure 6:
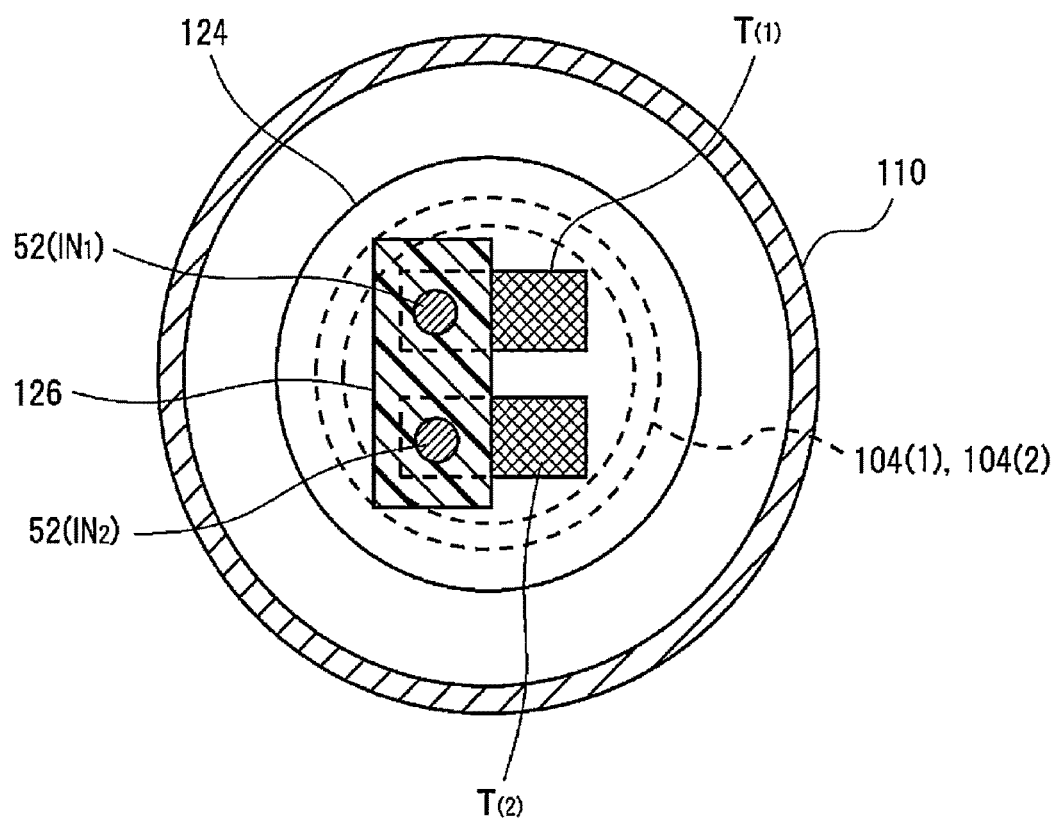
FIG. 6 is a plane view illustrating a configuration of an upper end portion of the filter unit.

FIG. 4 to FIG. 6 illustrate a physical structure and a layout of the filter unit 54(IN) in this example embodiment. The filter unit 54(IN) includes, as depicted in FIG. 4, a cylindrical conductive casing 110 made of, but not limited to, aluminum, in which the coil 104(1) of the first filter 102(1) and the coil 104(2) of the second filter 102(2) are accommodated coaxially. Further, the filter unit 54(IN) also includes a conductive capacitor box 112 coupled to a lower end of the casing 110 at the opposite side from the filter terminals $T_{(1)}$ and $T_{(2)}$. In the capacitor box 112, the capacitor 106(1) at the side of the first filter 102(1) and the capacitor 106(2) at the side of the second filter 102(2) (FIG. 3) are accommodated.

The casing 110 is vertically fitted, from the outside of the chamber 10, into the opening 114 formed in the bottom wall (base) 10a of the chamber 10 to be adjacent to the cylindrical conductive cover 42 (FIG. 1) that surrounds the power feed rod 40. The casing 110 is physically or electrically coupled to the bottom wall 10a of the chamber 10. Here, the casing 110 is fastened to the opening 114 of the bottom wall 10a of the chamber 10 such that top surfaces of the filter terminals $T_{(1)}$ and $T_{(2)}$ are not higher than the top surface of the bottom wall 10a of the chamber 10 (desirably, such that the top surfaces of the filter terminals $T_{(1)}$ and $T_{(2)}$ and the top surface of the bottom wall 10a are located on the same plane at the same height). In this case, it may be desirable that an upper end of the casing 110 is not higher than the top surface of the bottom wall 10a of the chamber 10.

Each of the coils 104(1) and 104(2) is implemented by an air core coil, and has a thick coil wire and a large coil size (e.g., a diameter of about 22 mm to about 45 mm and a length of about 130 mm to about 280 mm). With this configuration, each of coils 104(1) and 104(2) may serve as a power feed line through which a sufficiently large electric current (e.g., about 30 A) flows in the inner heating wire 50(IN) from the heater power supply 58(IN), and further, may obtain very large inductance with the air core without having a magnetic core such as ferrite for the purpose of suppressing heat generation (power loss) and obtain a long line length.

The coils 104(1) and 104(2) are spirally wound at the same winding pitch and the same coil length S within the cylindrical casing 110 while being overlapped in an axial direction along an outer surface of a cylindrical rod shaft (bobbin) 118 which is made of an insulator, e.g., a resin and uprightly standing on a lower connector 116 made of, e.g., an insulator such as a resin. Conducting wires of the coils 104(1) and 104(2) are made of, as illustrated in FIG. 5, a thin-plate or flat copper wire desirably having the same cross sectional area, and the conducting wire of the air core coil 104(2), which is any one of the coils, is covered with an insulating tube 120. Here, if the two coils 104(1) and 104(2) can be stably held in place as one body by an adhesive or another supporting member other than the rod shaft 118, the rod shaft 118 can be omitted.

Lower ends of the coils 104(1) and 104(2) are electrically connected to connection conductors 122(1) and 122(2) within the lower connector 116, respectively. The connection conductors 122(1) and 122(2) are connected to the connection points $n_{(1)}$ and $n_{(2)}$ and the capacitors 106(1) and 106(2) (FIG. 3), respectively, within the capacitor box 112.

An upper connector 124 made of an insulator, e.g., a resin is coupled to an upper end of the rod shaft 118 at the vicinity of the upper end of the casing 110. The filter terminals $T_{(1)}$ and $T_{(2)}$, that have a plate-piece shape or a block shape and are made of, for example, copper, are protruded and exposed on a top surface of the upper connector 124. The filter terminals $T_{(1)}$ and $T_{(2)}$ are connected to upper ends of the coils 104(1) and 104(2), respectively, within the upper connector 124.

The upper end of the casing 110 is opened. Top surfaces of the filter terminals $T_{(1)}$ and $T_{(2)}$ are not shielded, but face the space SP directly under the susceptor 12 in an open state. The filter terminals $T_{(1)}$ and $T_{(2)}$ are connected to lower ends of the pin-shaped or rod-shaped power feed conductors 52(IN$_1$) and 52(IN$_2$) incorporated in an insulating supporting rod 126.

Figure 8:
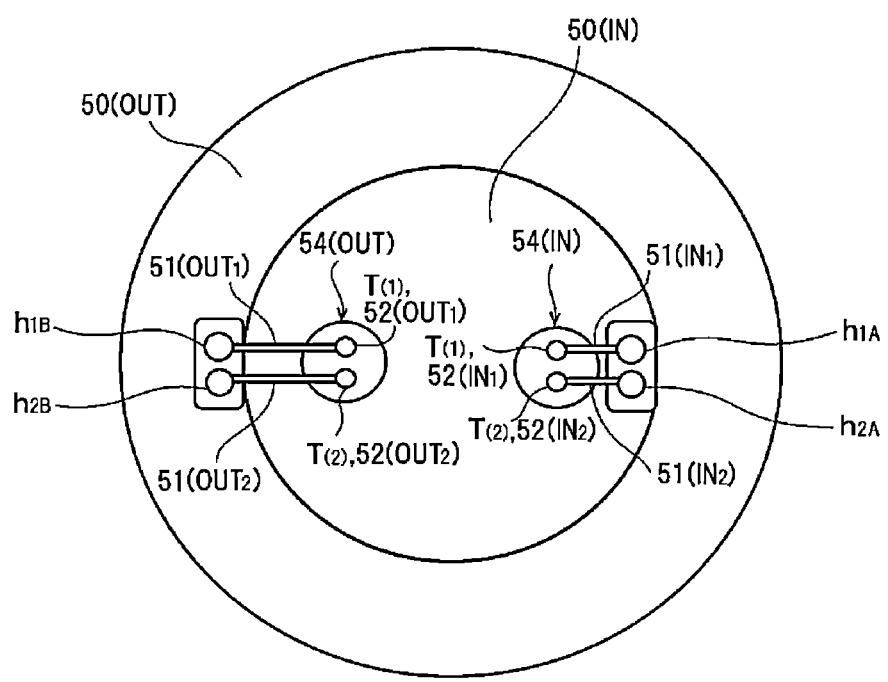
FIG. 8 is a schematic plane view illustrating the arrangement of the heater power feed line within and directly under the susceptor.
Figure 9:
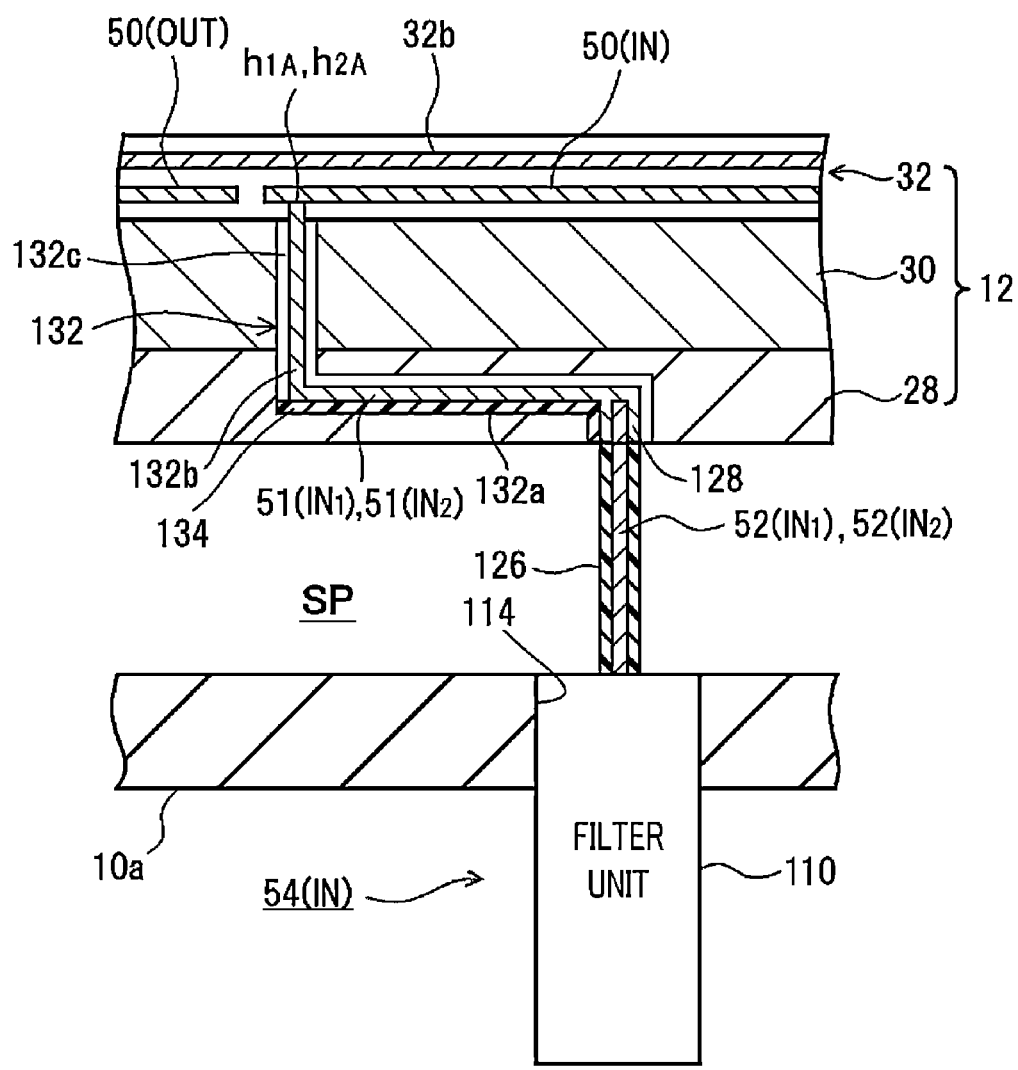
FIG. 9 is a longitudinal cross sectional view illustrating a modification example of the arrangement of the heater power feed line within the susceptor.

Further, the filter unit 54(OUT) has the same circuit configuration and physical structure as those of the filter unit 54(IN) and is provided to the bottom wall (base) 10a of the chamber 10 at a position opposite to the filter unit 54(IN) with respect to the power feed rod 40 therebetween, i.e., at a position in a point symmetry with respect to the filter unit 54(IN) (FIG. 8).

(Electrical Function of Filter Unit)

In the filter unit 54(IN) in accordance with the example embodiment, a distributed constant line 105 is formed between the coils 104(1) and 104(2) of the first and second filters 102(1) and 102(2) and the casing 110 serving as an external conductor.

In general, characteristic impedance $Z_o$ of a transmission line is expressed as $Z_o = \sqrt{(L/C)}$ by using electrostatic capacitance C per a unit length and inductance L per a unit length when no loss is assumed. Further, a wavelength λ is calculated by the following equation.

$$\lambda = 2\pi/(\omega\sqrt{(LC)}) \quad (1)$$

Unlike in a general distributed constant line (especially, in a coaxial line) where a rod-shaped cylindrical conductor serves as the central portion of the transmission line, the cylindrical coils serve as a central conductor in the filter unit 54(IN). It is assumed that the inductance L per a unit length is mainly caused by the cylindrical coil. Meanwhile, the electrostatic capacitance per a unit length is defined as electrostatic capacitance C of a capacitor formed by a coil surface and the external conductor. In this filter unit 54(IN), when the inductance per a unit length and the electrostatic capacitance per a unit length are L and C, respectively, it is assumed that a distributed constant line of which characteristic impedance $Z_o$ is expressed as $Z_o = \sqrt{(L/C)}$ is formed.

When the filter unit having this distributed constant line is viewed from the side of the terminal T, since an opposite side thereof is nearly short-circuited by the capacitor having large capacitance (e.g., about 5000 pF), there may be obtained a frequency-impedance characteristic in which large impedance is repeated at a constant frequency interval. This impedance characteristic may be obtained when the wavelength and the length of the distributed line are same.

In this filter unit 54(IN), not a winding length of the coils 104(1) and 104(2) but a coil length S in the axial direction (FIG. 4) becomes the length of the distributed line. By using the coils 104(1) and 104(2) as the central conductor, L can be increased to be much larger than that in case of using a rod-shaped cylindrical conductor as the central conductor, so that λ can be reduced. Thus, it is possible to realize an effective length that is a comparatively short line length (coil length S) and is equal to or larger than the wavelength. Further, it is possible to obtain an impedance characteristic in which large impedance is repeated at a comparatively short frequency interval.

Here, it is desirable that the characteristic impedance (particularly, the inductance and the capacitance per a unit length) is constant on the distributed constant line 105 formed between the coils 104(1) and 104(2) and the casing (external conductor) 110. This requirement for the constant characteristic impedance is strictly satisfied in the shown configuration example since the cylindrical coils 104(1) and 104(2) are coaxially arranged within the cylindrical casing (external conductor) 110. Further, even if there exist some irregularities in a gap (distance) between the coils 104(1) and 104(2) and the casing (external conductor) 110, if the irregularities are within a tolerance range (in general, equal to or smaller than about 1/4 of the wavelength of a high frequency noise to be blocked), the requirement for the constant characteristic impedance may be still substantially satisfied.

As stated above, in the filters 102(1) and 102(2), filter characteristics capable of achieving multiple parallel resonance and highly stable and reproducible impedance characteristics can be obtained.

(Arrangement of Heater Power Feed Line)

Figure 7:
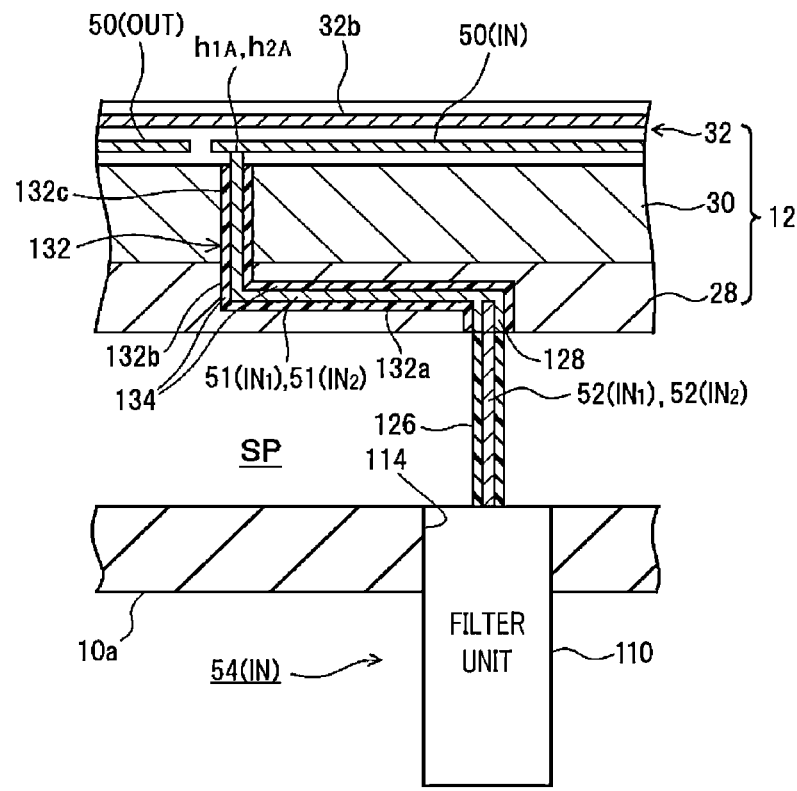
FIG. 7 is a longitudinal cross sectional view illustrating an arrangement of a heater power feed line within and directly under the susceptor.

FIG. 7 and FIG. 8 illustrate an arrangement of the heater power feed lines 100(1) and 100(2) within and directly under the susceptor 12. As depicted in FIG. 7, the insulating supporting rod 126 and the power feed conductors 52(IN$_1$) and 52(IN$_2$) embedded therein are vertically extended in a straight line without being bent to pass through the space SP vertically. Leading ends of the power feed conductors 52(IN$_1$) and 52(IN$_2$) are inserted into a socket terminal 128 that is fastened to and located on the same plane as the bottom surface of the susceptor 12 (backplate 28) while being electrically insulated from the bottom surface of the susceptor 12 (backplate 28).

The filter terminals $T_{(1)}$ and $T_{(2)}$ and the socket terminal 128 are located closer to the central portion of the chamber 10 than the terminals $h_{1A}$ and $h_{2A}$ of the inner heating wire 50(IN) (FIG. 8). A tunnel-shaped passage 132 (132a, 132b, and 132c) configured to allow the internal conductors 51(IN$_1$) and 51(IN$_2$) to pass therethrough is formed in the backplate 28 of the susceptor 12 and the lower high frequency electrode 30 (FIG. 7).

To elaborate, within the backplate 28, there are formed a horizontal passage 132a horizontally extended from the socket terminal 128 to a position directly under the heating wire terminals $h_{1A}$ and $h_{2A}$; and a vertical passage 132b vertically extended upward to the top surface of the backplate 28 from an end of the horizontal passage 132a. Further, within the lower high frequency electrode 30, there is formed a through hole as a vertical passage 132c vertically extended upwards from a position overlapped with the vertical passage 132b of the backplate 28. The internal conductors 51($IN_1$) and 51($IN_2$) are made of, e.g., a metal having high conductivity, such as copper, and are provided to pass through the inside of the passage 132 (132a, 132b, and 132c) while electrically insulated from the backplate 28 and the lower high frequency electrode 30 by an insulator 134 made of, e.g., a resin. The internal conductors 51($IN_1$) and 51($IN_2$) are electrically connected to the socket terminal 128 and the heating wire terminals $h_{1A}$ and $h_{2A}$ within the electrostatic chuck 32. The internal conductors 51($IN_1$) and 51($IN_2$) may have any shape, such as a pin shape, a rod shape or a plate shape.

In order to use the minimum insulator 134 within the passage 132, the insulator 134 may be provided (laid) only under the internal conductors 51($IN_1$) and 51($IN_2$) within the horizontal passage 132a of the backplate 28, while the insulator 134 may not be provided within the vertical passage 132b of the backplate 28 and the vertical passage 132c of the lower high frequency electrode 30.

(Operation in Example Embodiment)

The plasma processing apparatus employs the above-described configuration for the layout of the filter units 54(IN) and 54(OUT) and the arrangement of the heater power feed lines 100(1) and 100(2) at the vicinity of the susceptor 12. Thus, the plasma processing apparatus is capable of greatly improving a plasma density distribution characteristic on the susceptor 12 or in-plane uniformity of a process characteristic (e.g., an etching rate characteristic, etc.) on the semiconductor wafer W.

As discussed above, in a conventional plasma processing apparatus incorporating a heating element in a susceptor and having a filter configured to block or attenuate a high frequency noise on a heater power feed line that applies a power to the heating element, the layout of the filter units and the arrangement of the heater power feed line near the susceptor become one of factors causing asymmetry in a plasma density distribution characteristic on the susceptor or a process characteristic on a semiconductor wafer. To be more specific, as a part of a high frequency power applied to a lower high frequency electrode of the susceptor from a high frequency power supply leaks into the heater power feed line through the heating element, a plasma density or an etching rate may be decreased at the vicinity of the heater power feed line extended in a space directly under the susceptor. That is, a planar image of the heater power feed line extended in the space directly under the susceptor may be projected to the plasma generation space as a singularity that disturbs a plasma density distribution on the susceptor.

The present inventor has analyzed a potential distribution and an electric field distribution at the vicinity of the susceptor (particularly, directly under the susceptor) by electromagnetic field calculation. As a result, an electric potential on the heater power feed line is as high as a surface potential of the power feed rod or the lower high frequency electrode within the space directly under the susceptor (e.g., several thousands of volts), and after entering the filter unit, the electric potential is gradually decreased along the axial direction of the coils due to the impedance of the coils and finally reaches several tens of volts at the end of the coil.

In the conventional plasma processing apparatus, the filter unit is disposed within the space between the susceptor and a bottom wall of a chamber, and the heater power feed line (power feed conductor) is arranged in a transversal direction within the space. In such a configuration, the planar image of the heater power feed line (power feed conductor) extended in the transversal direction within the space or a planar image of a top surface (cover) of the filter unit may be projected to the plasma density distribution on the susceptor asymmetrically with a large area.

Furthermore, in the conventional plasma processing apparatus, without considering the layout of the filter unit (particularly, a filter unit for an outer heating wire) in a radial direction of the chamber, the filter unit may be placed directly under the vicinity of the susceptor. In such a case, a high-voltage heater power feed line (a power feed conductor) arranged within the space may serve as an antenna and radiate a high frequency power to a nearby member having a ground potential, e.g., to the conductive cylindrical supporting member 16 having a ground potential via the dielectric cylindrical supporting member 14 that easily transmits the high frequency power. As a result, a function of the filter configured to block the high frequency noise may be degraded remarkably.

As a solution, in the example embodiment, the filter units 54(IN) and 54(OUT) are not disposed within the space SP directly under the susceptor 12. Especially, in this example embodiment, the upper end of the casing 110 of the filter unit 54(IN) is provided to the opening 114 of the bottom wall (base) 10a of the chamber 10 to be located at a height position equal to or lower than the top surface of the bottom wall 10a of the chamber 10 directly under the susceptor. With this configuration, the coils 104(1) and 104(2) accommodated in the casing 110 are located at a position lower than the top surface of the bottom wall 10a of the chamber 10 having a ground potential. Accordingly, the coils 104(1) and 104(2) are electromagnetically shielded from the susceptor 12 by the bottom wall 10a of the chamber 10 to be not projected to the plasma generation space. That is, the coils do not serve as a singularity that disturbs the plasma density distribution. The same goes for the coils 104(1) and 104(2) of the filter unit 54(OUT).

Meanwhile, although the power feed conductors 52($IN_1$) and 52($IN_2$) arranged within the space SP are projected to the plasma density distribution on the susceptor 12, since the power feed conductors 52($IN_1$) and 52($IN_2$) are vertically extended in straight lines without being bent sideways, projecting areas thereof may be as small as possible. Further, since the power feed conductors 52($IN_1$) and 52($IN_2$) are located near the central portion of the chamber 10, the influence thereof upon the plasma density distribution on the susceptor 12 would be very small. The same goes for the power feed conductors 52($OUT_1$) and 52($OUT_2$) at the side of the filter unit 54(OUT).

Further, the internal conductors 51($IN_1$) and 51($IN_2$) arranged within the susceptor 12 are all accommodated (hidden) within the passage 132 of the conductive backplate 28 and the lower high frequency electrode 30. Thus, the internal conductors 51($IN_1$) and 51($IN_2$) may not affect the plasma generation space and not disturb the plasma density distribution on the susceptor 12 at all.

In the present example embodiment, since the power feed conductors 52($IN_1$) and 52($IN_2$) are located near the central portion of the chamber 10 and sufficiently isolated from the dielectric cylindrical supporting member 14, a high frequency power from the power feed conductors 52(IN$_1$) and 52(IN$_2$) may not be radiated to the conductive cylindrical supporting member 16 having a ground potential via the dielectric cylindrical supporting member 14. The same goes for the power feed conductors 52(OUT$_1$) and 52(OUT$_2$) on the side of the filter unit 54(OUT).

Further, in the filter unit 54(IN), the upper end of the casing 110 is opened, and the filter terminals T$_{(1)}$ and T$_{(2)}$ are exposed without being shielded and face the space SP directly under the susceptor 12 in an open state. Not only the power feed conductors 52(IN$_1$) and 52(IN$_2$) but also the insulating supporting rod 126 incorporating the power feed conductors 52(IN$_1$) and 52(IN$_2$) is not in contact with the bottom wall 10a of the chamber 10 (inner surface of the opening 114). Accordingly, a stray capacitance at the vicinity of the filter terminals T$_{(1)}$ and T$_{(2)}$ can be reduced sufficiently as will be described later, so that the frequency-impedance characteristic of the filters 102(1) and 102(2) can be stabilized. The same goes for the filter unit 54(OUT).

Figure 10A:
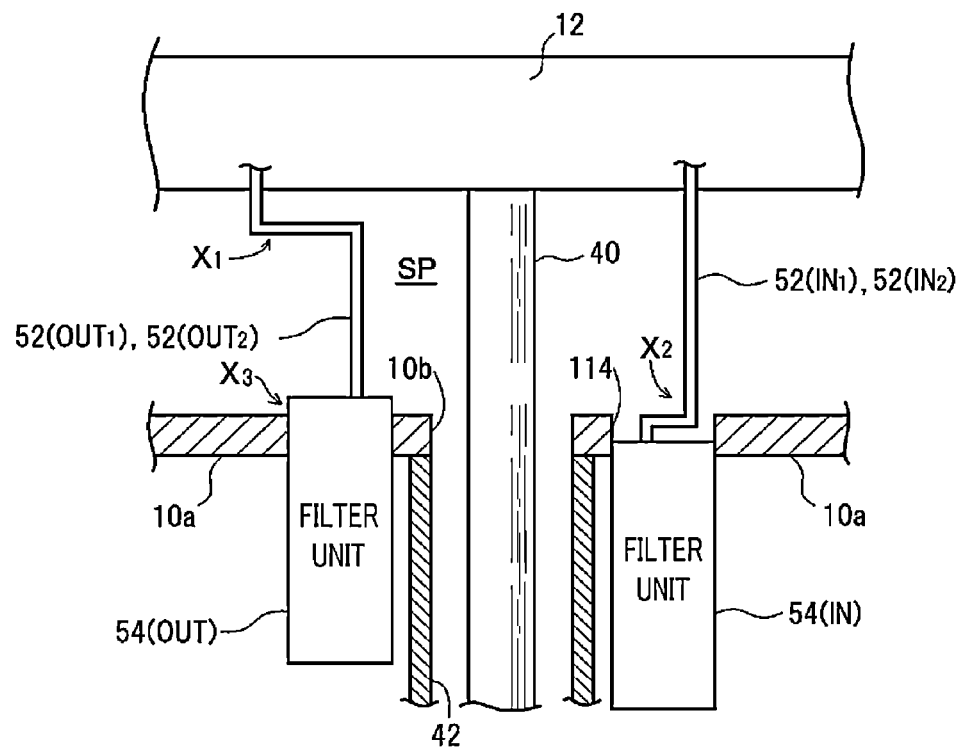
FIG. 10A is a diagram illustrating an undesirable example of a layout of the filter unit and an arrangement of a power feed conductor in accordance with the example embodiment.
Figure 10B:
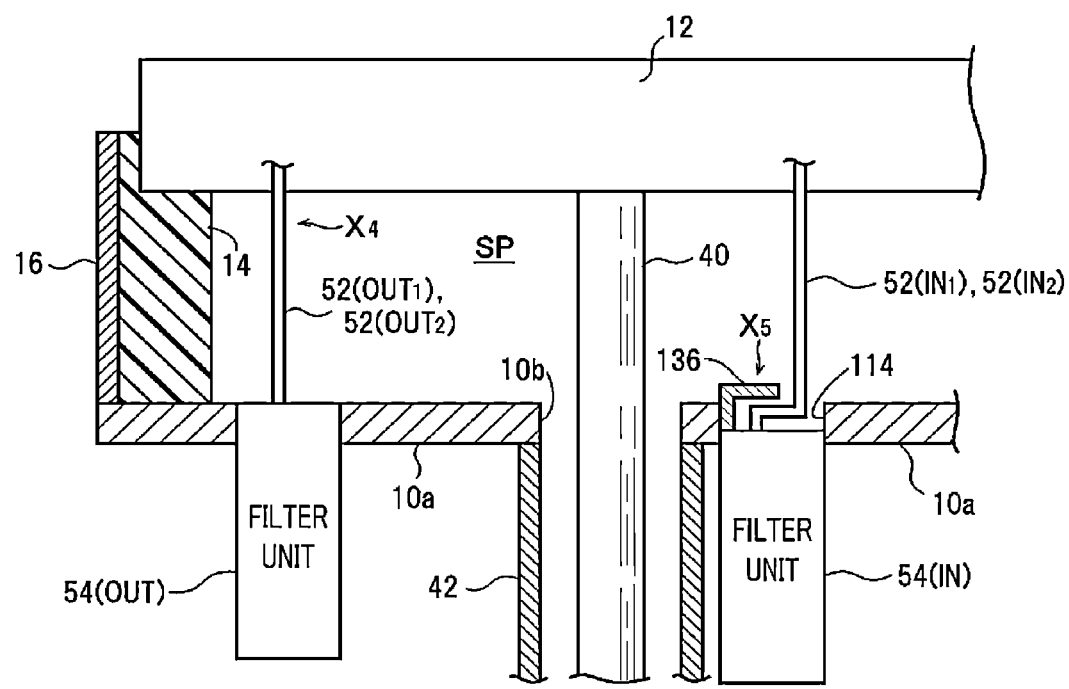
FIG. 10B is a diagram illustrating another undesirable example of a layout of the filter unit and an arrangement of a power feed conductor in accordance with the example embodiment.

FIG. 10A to FIG. 10B illustrate some examples X$_1$ to X$_5$ which are undesirable layout of the filter units 54(IN) and 54(OUT) and undesirable arrangement of the power feed conductors 52(IN$_1$), 52(IN$_2$), 52(OUT$_1$) and 52(OUT$_2$) in the present example embodiment.

By way of example, arranging the power feed conductors 52(OUT$_1$) and 52(OUT$_2$) in a transversal direction within the space SP (X$_1$ in FIG. 10A) may not be desirable because planar images of the power feed conductors 52(OUT$_1$) and 52(OUT$_2$) projected to the plasma density distribution on the susceptor 12 are increased as mentioned above. Further, arranging the power feed conductors 52(IN$_1$) and 52(IN$_2$) in a transversal direction at the vicinity of the opening 114 of the bottom wall 10a of the chamber 10 (X$_2$ in FIG. 10A) may also be undesirable because the stray capacitance increases as the power feed conductors 52(IN$_1$) and 52(IN$_2$) approach the bottom wall 10a of the chamber 10. Further, it may not be desirable that the casing 110 of the filter unit 54(OUT) is protruded higher than the top surface of the bottom wall 10a of the chamber 10 (X$_3$ in FIG. 10A) because the protruded part of the casing 110 is projected to the plasma density distribution on the susceptor 12.

Further, locating the power feed conductors 52(OUT$_1$) and 52(OUT$_2$) near the dielectric cylindrical supporting member 14 (X$_4$ in FIG. 10B) may not be desirable because a high frequency power may be easily radiated to the conductive cylindrical supporting member 16 having a ground potential from the power feed conductors 52(OUT$_1$) and 52(OUT$_2$) via the dielectric cylindrical supporting member 14, as mentioned above. By way of example, high frequency power transmissivity of the dielectric cylindrical supporting member 14 made of, e.g., ceramic having a dielectric constant of about 10 may be equivalent to that of a space having an about 1/10 thickness thereof. That is, since the dielectric cylindrical supporting member 14 is provided between the power feed conductors 52(OUT$_1$) and 52(OUT$_2$) and the conductive cylindrical supporting member 16, the power feed conductors 52(OUT$_1$) and 52(OUT$_2$) may become closer to the conductive cylindrical supporting member 16 having a ground potential.

Further, providing a cover 136 configured to cover the filter terminals T$_{(1)}$ and T$_{(2)}$ and the lower ends of the power feed conductors 52(IN$_1$) and 52(IN$_2$) at the opening 114 of the bottom wall 10a of the chamber 10 (X$_5$ of FIG. 10B) may not be desirable because any member protruded above the bottom wall 10a of the chamber 10 is projected to the plasma density distribution on the susceptor 12 and cause an increase of a stray capacitance near the filter terminals T$_{(1)}$ and T$_{(2)}$ regardless of the material (a conductor or a dielectric material) which the member is made of.

Though not shown, presence of a protrusion protruded into the space SP from the bottom surface of the susceptor 12 or from the bottom wall 10a of the chamber 10 may not be desirable because the protrusion affects the plasma density distribution on the susceptor 12.

Figure 11:
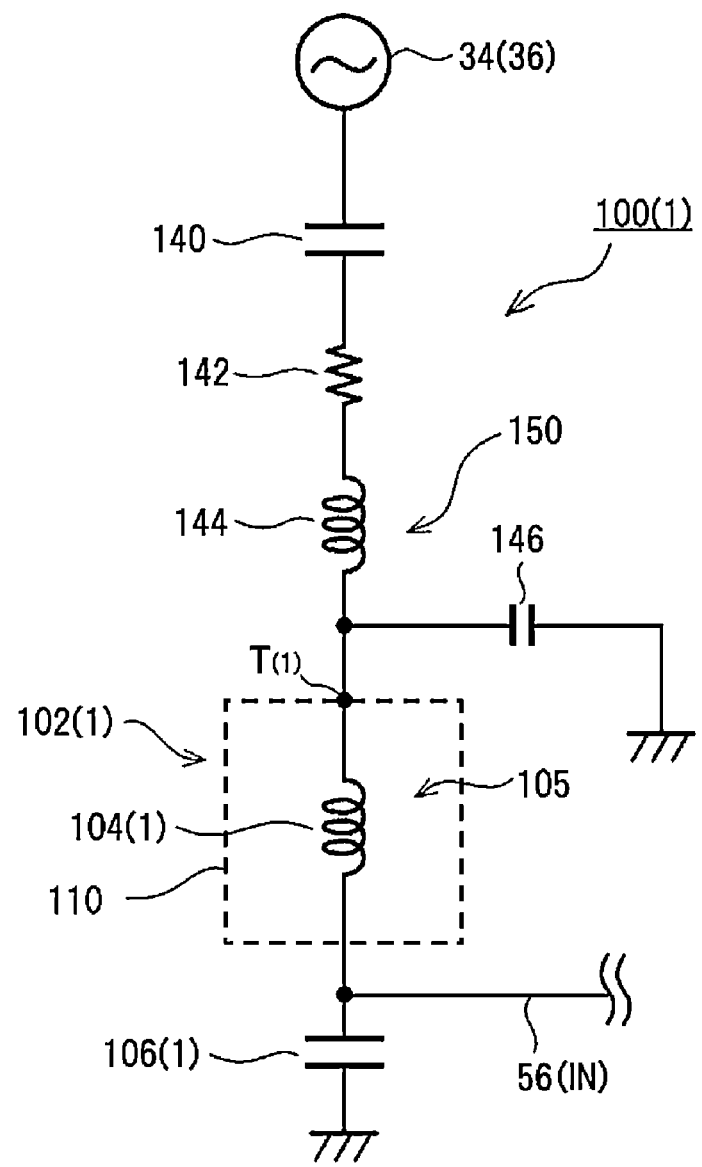
FIG. 11 is a diagram illustrating an equivalent circuit of a high frequency power propagation path in which a high frequency noise flows to the ground through the heater power feed line in accordance with the example embodiment.

FIG. 11 shows an equivalent circuit of a high frequency power propagation path in which a high frequency noise flows to the ground through the first heater power feed line 100(1) from the high frequency power supply 34(36) in this example embodiment. In this equivalent circuit, a capacitor 140 is electrostatic capacitance between the high frequency electrode 30 and the inner heating wire 50(IN) and the internal conductor 51(IN$_1$). A resistor 142 is a resistor of the inner heating wire 50(IN). An inductor 144 is inductance of the power feed conductor 52(IN$_1$), and a capacitor 146 is a stray capacitance at the vicinity of the power feed conductor 52(IN$_1$) and the filter terminal T$_{(1)}$. Here, a stray capacitance and a resistance within the filter 102(1) are neglected (omitted).

Figure 12:
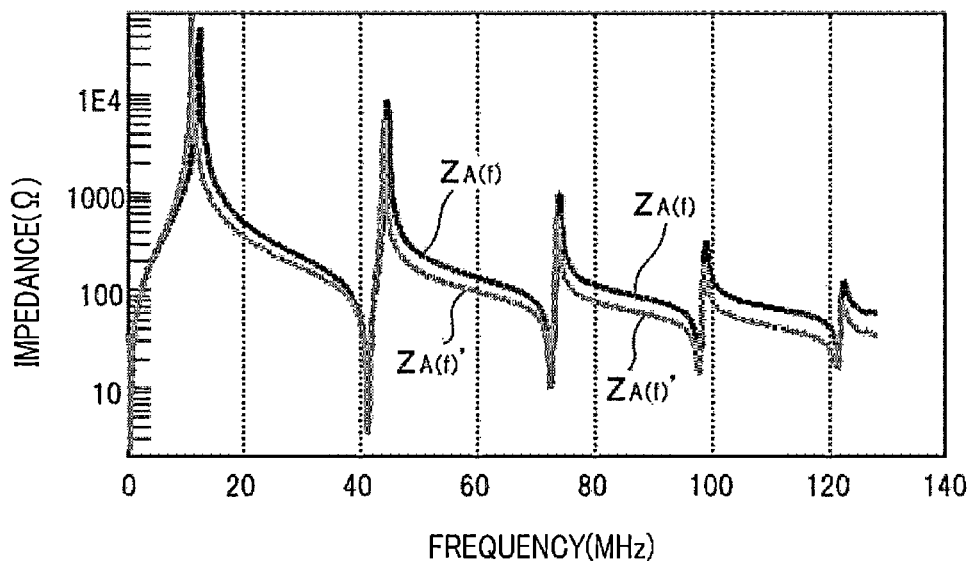
FIG. 12 is a diagram showing a frequency-impedance characteristic of a filter in the equivalent circuit.

In this equivalent circuit, a frequency-impedance characteristic Z$_{A(f)}$, with respect to the high frequency power propagation path from the susceptor 12 to the ground potential via the inductor 144, the capacitor (stray capacitance) 146, the coil 104(1) within the filter 102(1) and the capacitor 106(1), is illustrated in FIG. 12, for example. Further, a frequency-impedance characteristic Z$_{B(f)}$, with respect to the high frequency power propagation path from the susceptor 12 to the ground potential via the inductor 144 and the capacitor (stray capacitance) 146, is depicted in FIG. 13, for example.

The frequency-impedance characteristic Z$_{A(f)}$ of the filter 102(1) is a composition of a frequency-impedance characteristic (multiple parallel resonance characteristic) of the distributed constant line 105 formed by the coil 104(1) and the casing 110 serving as the external conductor; and the frequency-impedance characteristic Z$_{B(f)}$ of an LC series circuit 150 composed of the inductor 144 and the capacitor (stray capacitance) 146. That is, in the frequency-impedance characteristic of the distributed constant line 105, as the frequency increases toward a series resonance frequency f$_{SR}$ of the LC series circuit 150, a peak value of a parallel resonance point in the multiple parallel resonance characteristic is lowered gradually due to the frequency-impedance characteristic of the LC series circuit 150 located at an upstream end thereof.

Figure 13:
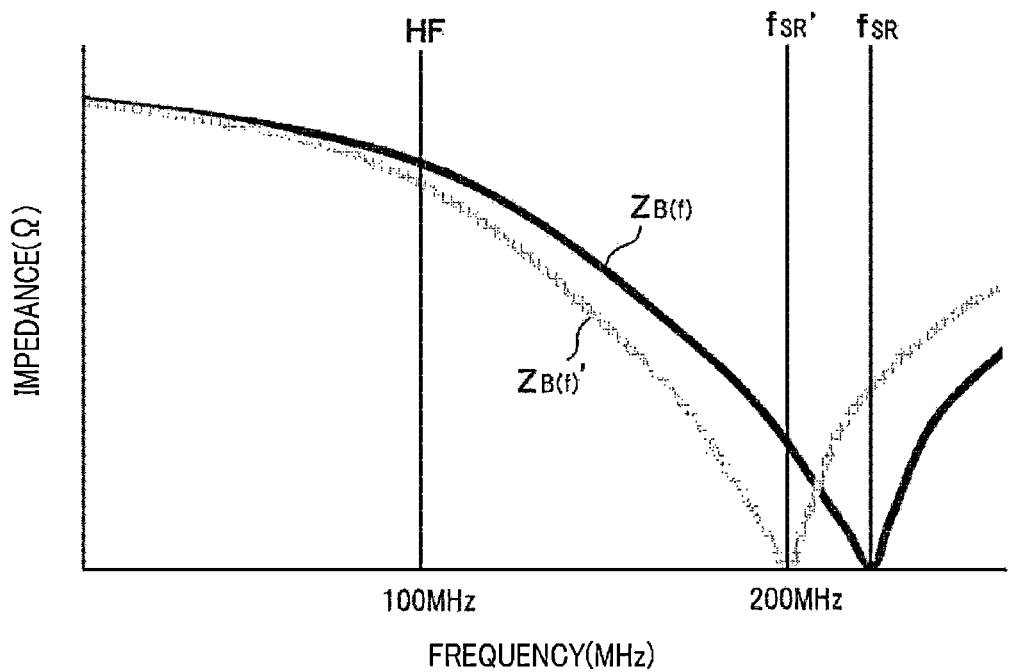
FIG. 13 is a diagram showing a frequency-impedance characteristic of an LC series circuit in the equivalent circuit.

Here, in the frequency-impedance characteristic Z$_{B(f)}$ of the LC series circuit 150, as the electrostatic capacitance of the capacitor 146 increases, the series resonance frequency f$_{SR}$ is decreased to f$_{SR'}$ (f$_{SR}$→f$_{SR'}$), and impedance in a frequency range lower than that is decreased entirely to Z$_{B(f)'}$ (Z$_{B(f)}$→Z$_{B(f)'}$), as shown in FIG. 13. Then, as depicted in FIG. 12, in the frequency-impedance characteristic Z$_{A(f)}$ of the filter 102(1), impedance is also lowered at all parallel resonance points and in the frequency range lower than the series resonance frequency f$_{SR}$(Z$_{A(f)}$→Z$_{A(f)'}$).

Further, when a fundamental frequency of the first high frequency power HF for plasma generation is, for example, about 100 MHz, the second harmonic frequency thereof is about 200 MHz. Here, as shown in FIG. 13, for example, if the series resonance frequency f$_{SR}$ is moved to a lower frequency range and approaches the second harmonic frequency (about 200 MHz), a high current of the second harmonic frequency flows in the heater power feed line 100(1).

Accordingly, in order to stabilize the function of the filter 102(1) to block the high frequency noise, it is important to minimize the stray capacitance 146 at the vicinity of the power feed conductor 52(IN$_1$) and the filter terminal T$_{(1)}$. In this example embodiment, as described above, in the filter unit 54(IN), the upper end of the casing 110 is opened, and the filter terminal T$_{(1)}$ is exposed without being shielded and faces the space SP directly under the susceptor 12 in the open state. Not only the power feed conductor 52(IN$_1$) but also the insulating supporting rod 126 incorporating the power feed conductor 52(IN$_1$) therein is not in contact with the bottom wall 10a of the chamber 10 (the inner surface of the opening 114). With this configuration, by setting the stray capacitance 146 to be as small as possible, the series resonance frequency f$_{SR}$ of the LC series circuit 150 can be set to be as large as possible, and the frequency-impedance characteristic (particularly, the multiple parallel resonance characteristic) of the filter 102(1) can be stabilized. The same goes for the second heater power feed line 100(2).

Further, in this example embodiment, although it is possible to separate the casing 110 of the filter units 54(IN) and 54(OUT) from the opening 114 in the bottom wall 10a of the chamber 10 and place the casing 110 under the bottom wall 10a of the chamber 10, such arrangement may not be desirable. That is, if the opening 114 formed through the bottom wall 10a of the chamber 10 is opened, the opening 114 may serve as a singularity that increases the plasma density distribution on the susceptor 12. Furthermore, as the power feed conductors 52(IN$_1$) and 52(IN$_2$) pass through the opening 114, the stray capacitance 146 at the vicinity of the power feed conductors 52(IN$_1$) and 52(IN$_2$) is increased. In addition, dirt, dust, moisture and the like in the atmosphere may be introduced through the opening 114, which is undesirable. Thus, it may be desirable that the casing 110 of the filter units 54(IN) and 54(OUT) is fastened to the opening 114 to close the opening 114 of the bottom wall 10a of the chamber 10. It may be most desirable, as in the present example embodiment, that the top surfaces of the filter terminals T$_{(1)}$ and T$_{(2)}$ are the same level as the top surface of the bottom wall 10a of the chamber 10.

(Other Example Embodiment or Modification Examples)

In the foregoing, although various example embodiments of the present disclosure have been described for the purpose of illustration, it will be appreciated that the present disclosure may not be limited thereto and various modifications may be made without departing from the scope and spirit of the present disclosure.

Figure 14:
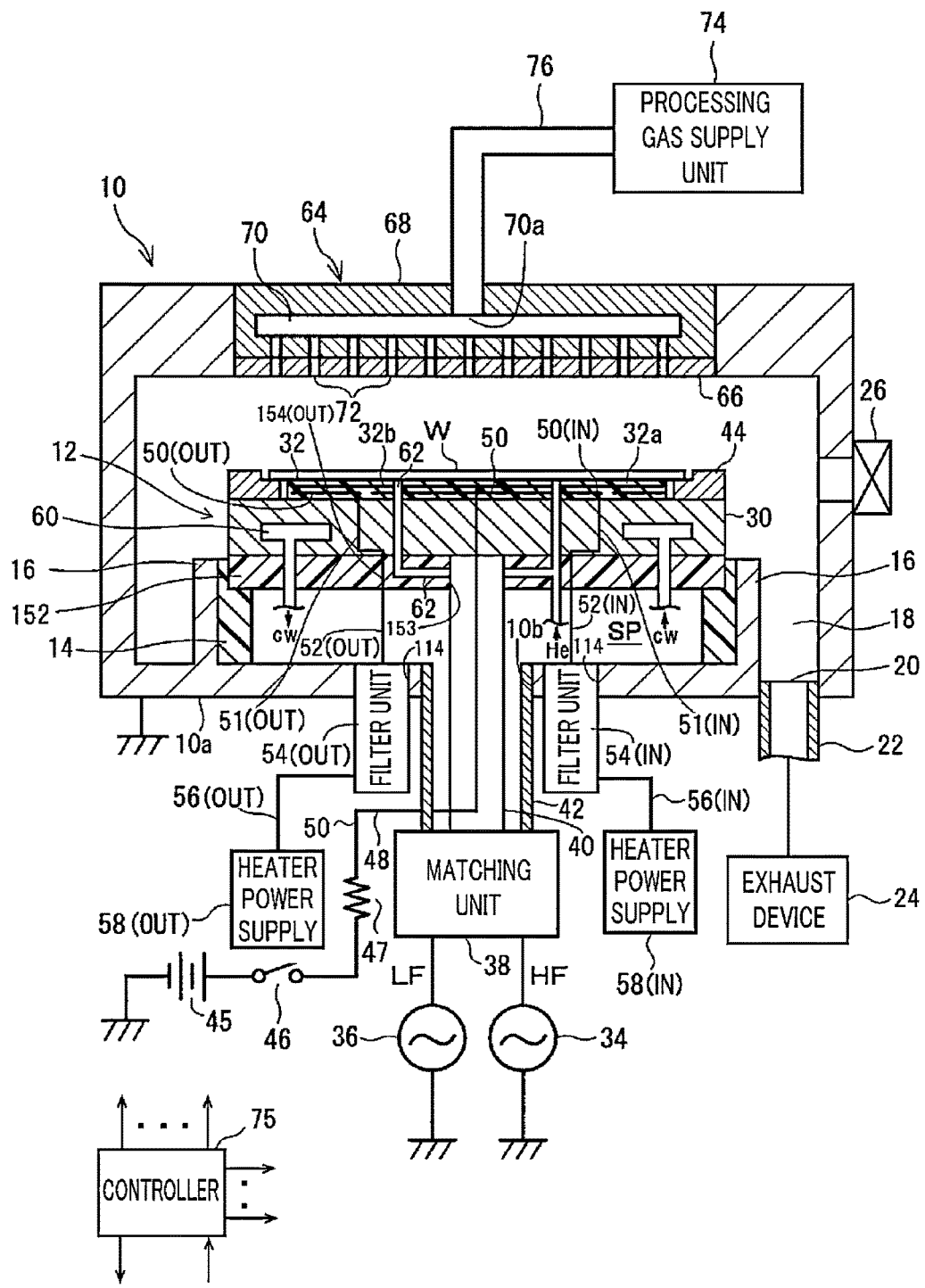
FIG. 14 is a cross sectional view illustrating a configuration example in which an insulating backplate is provided at a susceptor in the plasma processing apparatus.
Figure 15:
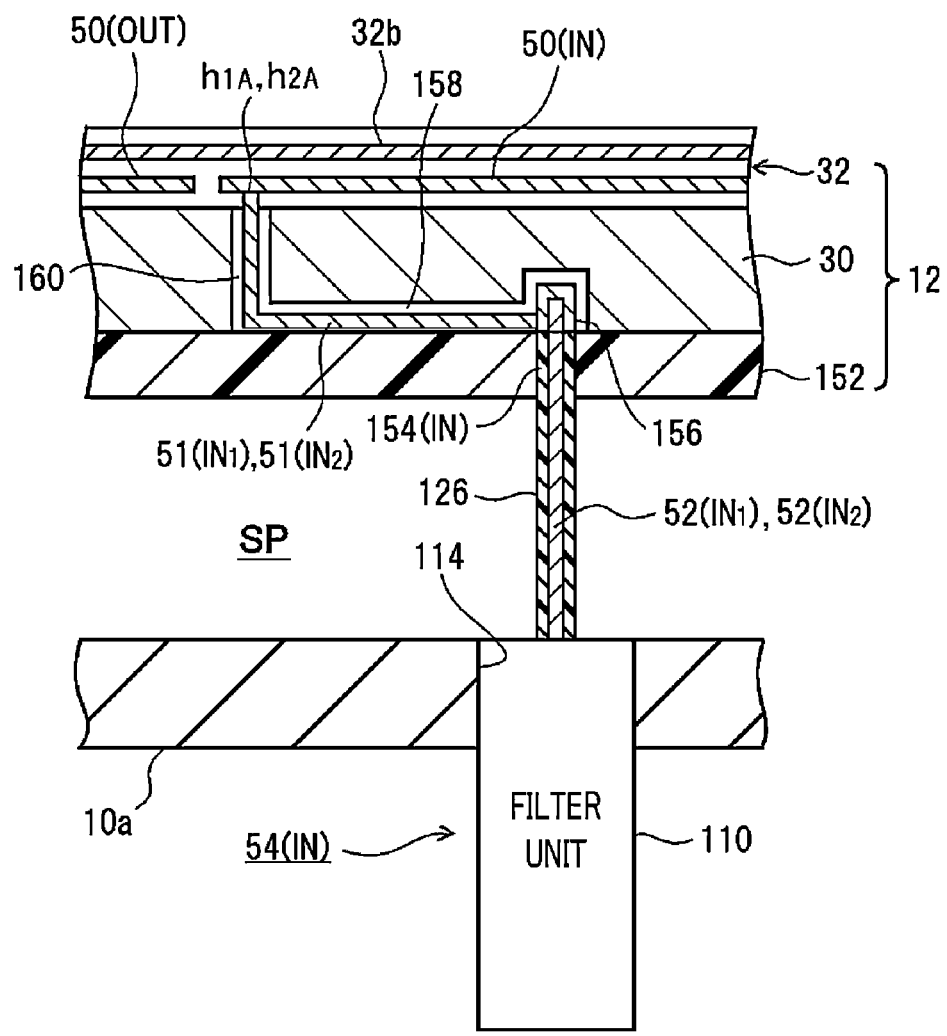
FIG. 15 is a partial cross sectional view illustrating major components of the apparatus of FIG. 14.

By way of example, in the plasma processing apparatus of the above-described example embodiment, it may be also possible to set up a configuration in which an insulating backplate 152 is provided at the susceptor 12, as illustrated in FIG. 14 and FIG. 15. The backplate 152 is provided such that a top surface thereof is contacted to the top surface of the lower high frequency electrode 30 while a bottom surface thereof faces the space SP.

A through hole 153 configured to allow the power feed rod 40 to be led to the lower high frequency electrode 30 therethrough is formed at a central portion of the backplate 152. Further, through holes 154(IN) and 154(OUT) configured to allow the power feed conductors 52(IN$_1$) and 52(IN$_2$) and the power feed conductors 52(OUT$_1$) and 52(OUT$_2$) to be led to the lower high frequency electrode 30 therethrough are formed at portions of the backplate 152 directly above the filter units 54(IN) and 54(OUT).

A socket terminal 156 configured to accommodate upper ends of the power feed conductors 52(IN$_1$) and 52(IN$_2$) are provided at the bottom surface of the lower high frequency electrode 30. Further, a groove 158 horizontally extended from the socket terminal 156 to a position directly under the heating wire terminals h$_{1A}$ and h$_{2A}$ is formed in a bottom surface of the lower high frequency electrode 30, and a vertical passage 160 as a through hole vertically extended upwards from an end of the groove 158 up to the top surface of the lower high frequency electrode 30 is also formed in the lower high frequency electrode 30. The internal conductors 51(IN$_1$) and 51(IN$_2$) are allowed to pass through the groove 158 to be extended along the top surface of the backplate 152 from the socket terminal 156, and then, pass through the vertical passage 160 upwards from the end of the groove 158, to reach the heating wire terminals h$_{1A}$ and h$_{2A}$.

As stated above, when providing the insulating backplate 152 to the susceptor 12, the configuration in which the internal conductors 51(IN$_1$) and 51(IN$_2$) are arranged in the horizontal direction within the groove 158 formed in the bottom surface of the lower high frequency electrode 30 is adopted. With this configuration, the internal conductors 51(IN$_1$) and 51(IN$_2$) are hidden inside the lower high frequency electrode 30, and the flatness of the bottom surface of the lower high frequency electrode 30 can be substantially obtained. Thus, a plasma density distribution on the susceptor 12 may not be affected by an arrangement of the internal conductors 51(IN$_1$) and 51(IN$_2$).

In the above-described example embodiment, the heating element 50 provided in the susceptor 12 is divided in two parts into the inner heating wire 50(IN) and the outer heating wire 50(OUT) in the radial direction of the susceptor 12. However, it may be also possible to divide the heating element 50 in three parts in the radial direction, for example: an inner heating wire 50(IN), an intermediate heating wire 50(MI) and an outer heating wire 50(OUT). Alternatively, it may be also possible to divide the heating element 50 in four parts in the radial direction, for example: an inner heating wire 50(IN), an inner intermediate heating wire 50(MI$_{in}$), an outer intermediate heating wire 50(MI$_{out}$) and an outer heating wire 50(OUT).

Figure 16A:
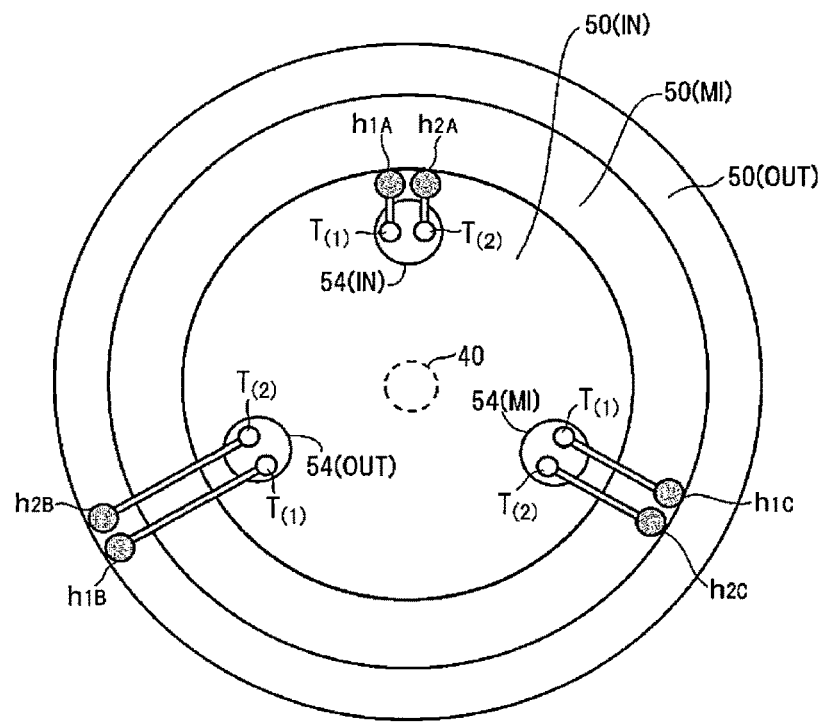
FIG. 16A is a schematic plane view illustrating an example of a layout of the filter unit and an arrangement of a heater power feed line when a heating element is of a 3-division type in accordance with the example embodiment.

In the 3-division type, as illustrated in FIG. 16A, it may be desirable to arrange three filter units 54(IN), 54(MI) and 54(OUT) corresponding to the inner heating wire 50(IN), the intermediate heating wire 50(MI) and the outer heating wire 50(OUT), respectively, concentrically at the central portion of the chamber 10, i.e., the power feed rod 40 at an equal interval (120°). In such a case, the filter unit 54(IN) may be disposed at an inner side (a central side) than the terminals h$_{1A}$ and h$_{2A}$ of the inner heating wire 50(IN) in the radial direction.

Figure 16B:
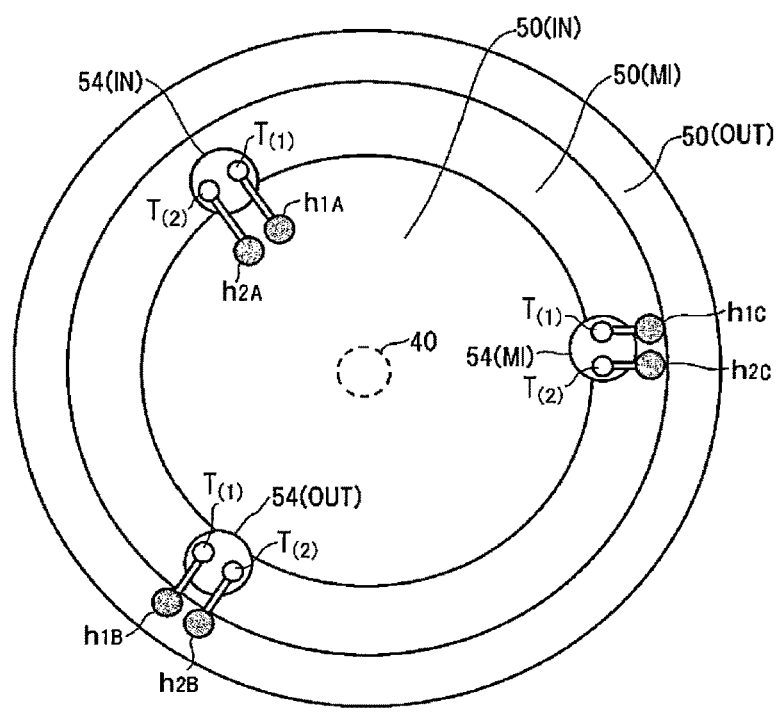
FIG. 16B is a schematic plane view illustrating another example of a layout of the filter unit and an arrangement of a heater power feed line when a heating element is of a 3-division type.

Further, when a sufficient distance can be secured between the filter units 54(IN), 54(MI) and 54(OUT) and the dielectric cylindrical supporting member 14, it may be also possible to locate the filter unit 54(IN) at an outer side than the terminals h$_{1A}$ and h$_{2A}$ of the inner heating wire 50(IN) in the radial direction, as depicted in FIG. 16B. In this case, it may be desirable that the three filter units 54(IN), 54(MI) and 54(OUT) are arranged concentrically at an equal interval (120°).

Figure 17A:
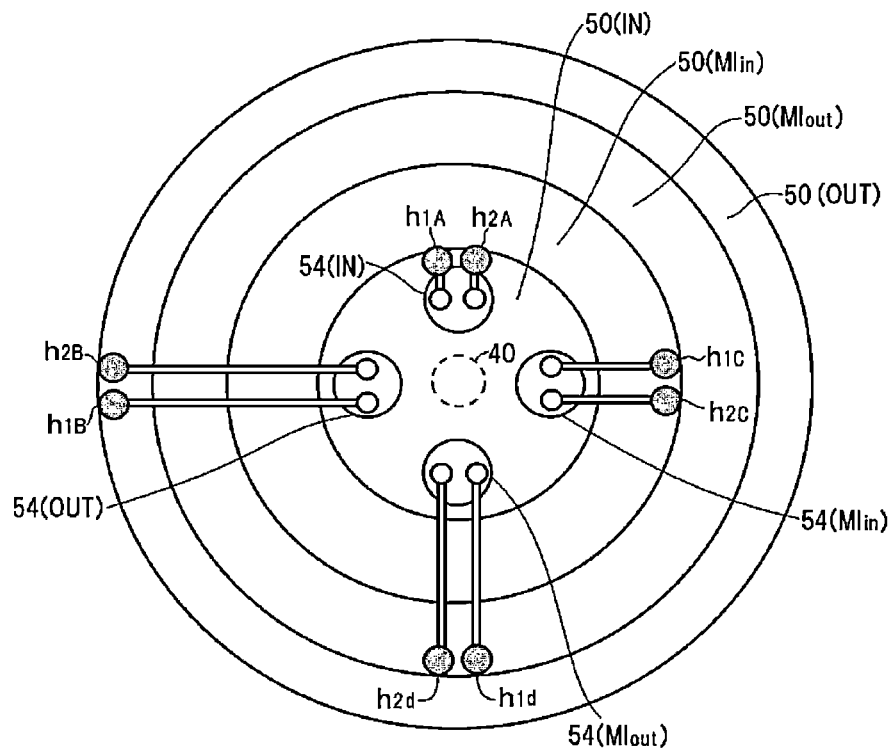
FIG. 17A is a schematic plane view illustrating an example of a layout of the filter unit and an arrangement of a heater power feed line when a heating element is of a 4-division type.

Likewise, in the four-division type, as illustrated in FIG. 17A, it may be desirable to arrange four filter units 54(IN), 54(MI$_{in}$), 54(MI$_{out}$), and 54(OUT) corresponding to the inner heating wire 50(IN), the inner intermediate heating wire 50(MI$_{in}$), the outer intermediate heating wire 50(MI$_{out}$) and the outer heating wire 50(OUT), respectively, concentrically at the central portion of the chamber 10, i.e., the power feed rod 40 at an equal interval (90°). In this case, the filter unit 54(IN) is positioned at an inner side (central side)

than the terminals $h_{1A}$ and $h_{2A}$ of the inner heating wire 50(IN) in the radial direction.

Figure 17B:
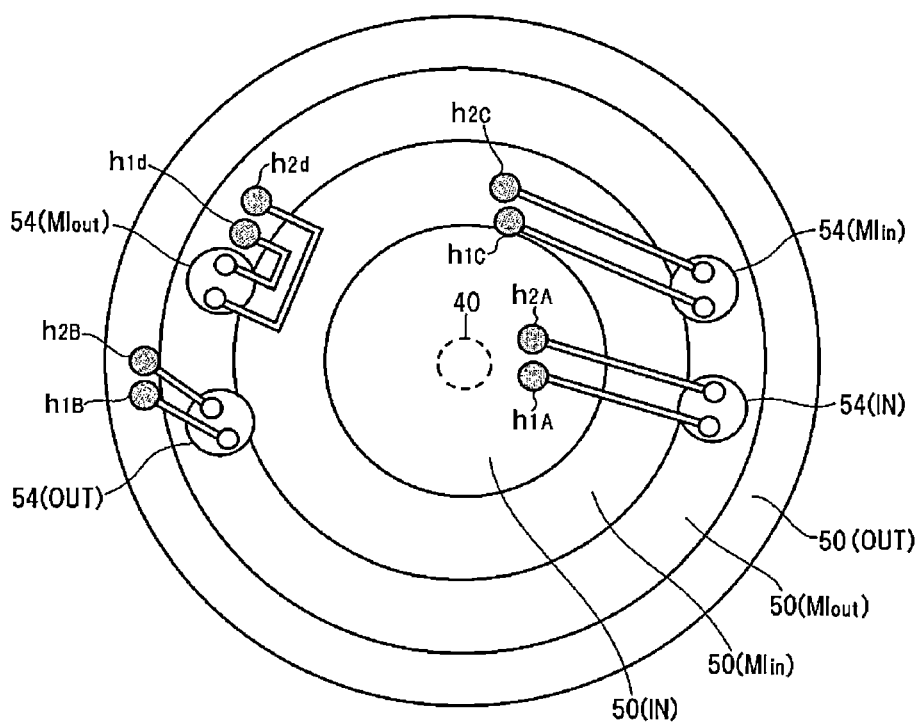
FIG. 17B is a schematic plane view illustrating another example of layout of the filter unit and an arrangement of a heater power feed line when a heating element is of a 4-division type.
Figure 17C:
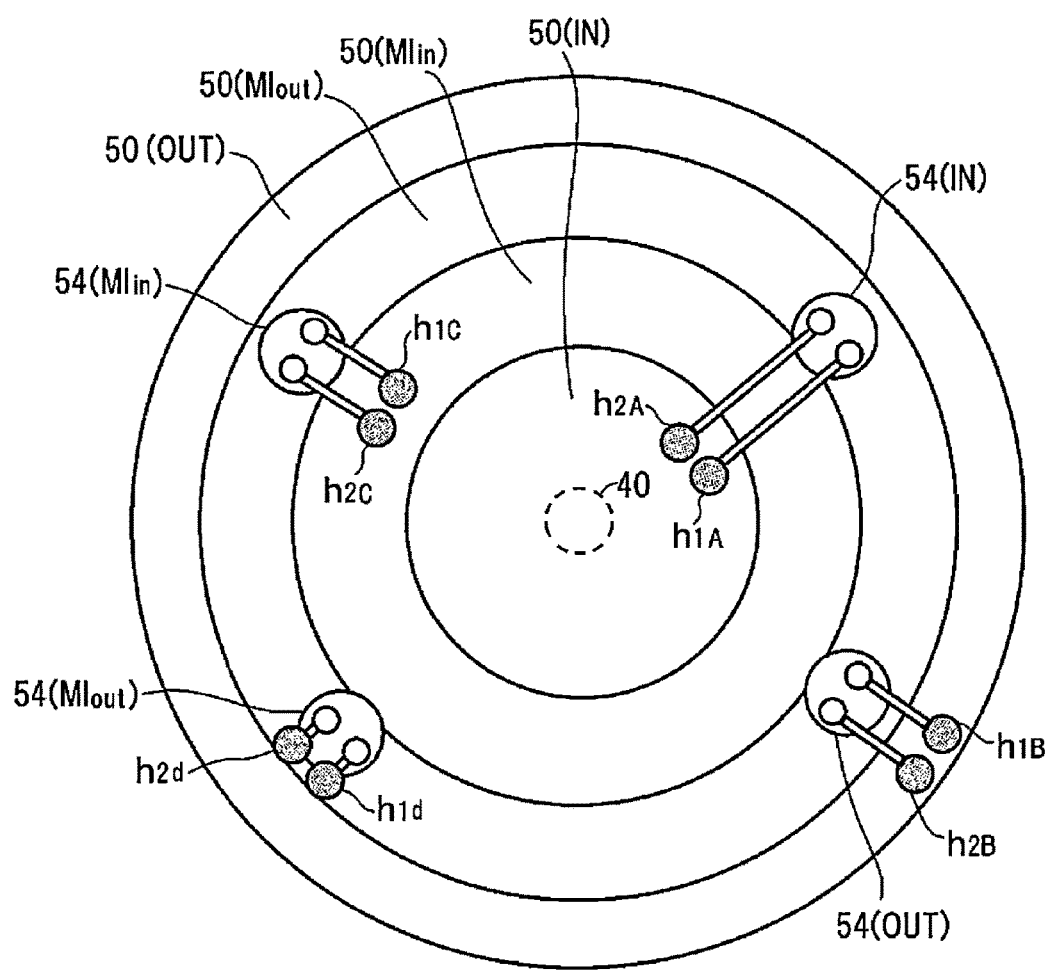
FIG. 17C is a schematic plane view illustrating still another example of a layout of the filter unit and an arrangement of a heater power feed line when a heating element is of a 4-division type.

Further, when a sufficient distance can be secured between the filter units 54(IN), 54($MI_{in}$), 54($MI_{out}$), and 54(OUT) and the dielectric cylindrical supporting member 14, it may be possible to locate these filter units at outer sides than the inner heating wire 50(IN) or the inner intermediate heating wire 50($MI_{in}$) in the radial direction, as depicted in FIG. 17B. In such a case, it may be desirable to arrange the four filter units 54(IN), 54($MI_{in}$), 54($MI_{out}$), and 54(OUT) concentrically at an equal interval (90°) as depicted in FIG. 17C.

Furthermore, in the present example embodiment, the internal configuration of the filter unit 54 can be modified in various ways. By way of example, although the filter 102(1) and 102(2) provided in the filter unit 54 are single air core coils 104(1) and 104(2) in the above-described example embodiment, a configuration of using a multiple number of coils connected in series or a configuration of using a coil having a core (e.g., a toroidal coil) may also be adopted.

Figure 18:
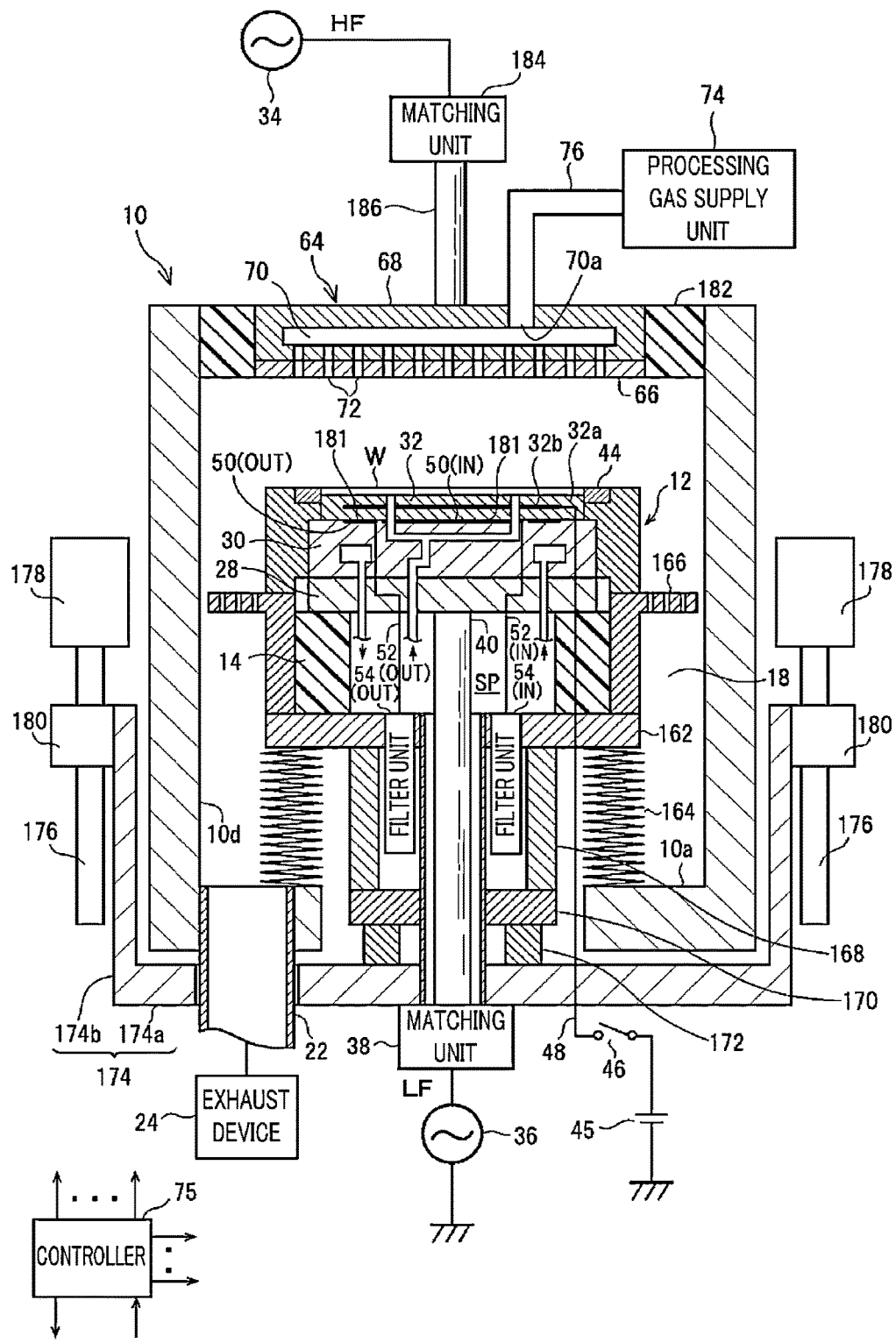
FIG. 18 is a longitudinal cross sectional view illustrating a configuration example where the susceptor of the plasma processing apparatus can be movable up and down.

In the above-described embodiment, the susceptor 12 is located at a certain height position above the bottom wall 10a of the chamber 10 with the space SP therebetween. As depicted in FIG. 18, however, in a plasma processing apparatus in which the susceptor 12 is configured to be vertically movable or displacable within the chamber 10, the filter units 54(IN) and 54(OUT) can be provided at a movable base 162 that can be moved up and down while supporting the susceptor 12 via the dielectric cylindrical supporting member 14. Here, the space SP communicating with the atmosphere space is formed among the susceptor 12, the dielectric cylindrical supporting member 14 and the movable base 162.

A cylindrical bellows 164 is provided between the movable base 162 and the bottom wall 10a of the chamber 10. The bellows 164 extends downward the exhaust path 18 communicating with the plasma generation space (processing space) via a baffle plate 166 while isolating or blocking the exhaust path 18 and the plasma generation space (processing space) from the atmosphere space.

In a space surrounded by the bellows 164, an upper leg member 168, an annular plate 170 and a lower leg member 172 are connected in a vertical direction. An upper end of the upper leg member 168 is coupled to a bottom surface of the movable base 162, while a lower end of the upper led part 168 is fastened to a top surface of the annular plate 170. An upper end of the lower leg member 172 is coupled to a bottom surface of the annular plate 170, and a lower end of the lower leg member 172 is coupled to a plate member 174a of a link 174.

The link 174 includes the plate member 174a and two column-shaped members 174b. The plate member 174a is provided under a lower portion of the chamber 10. In this configuration example, the matching unit 38 is fastened to the plate member 174a.

A through hole extended in an axial Z direction is formed in each of the plate member 174a, the annular plate 170 and the movable base 162. The lower power feed rod 40 is vertically extended to the bottom surface of the susceptor 12 (the conductive backplate 28) through the through holes.

The column-shaped members 174b are extended upwards from the peripheral portion of the plate member 174a. Further, the column-shaped members 174b are extended substantially in parallel to a sidewall 10d of the chamber 10 at the outside of the chamber 10. An elevating device composed of, by way of example, but not limitation, ball screws is connected to the column-shaped members 174b.

To elaborate, two screw shafts 176 are extended substantially in parallel to the two column-shaped members 174b at the outside of the sidewall 10d of the chamber 10. The screw shafts 176 are connected to two motors 178, respectively. Further, two nuts 180 are fastened to the screw shafts 176, respectively, and the two column-shaped members 174b are coupled to the nuts 180, respectively.

In this elevating device, by rotating the motors 178, the nuts 180 are moved in the axial Z direction, i.e., moved up and down. Along with the up and down movements of the nuts 180, the susceptor 12 indirectly supported by the link 174 via the movable base 162 can also be moved in the axial Z direction, i.e., moved up and down. Further, as the susceptor 12 is moved up and down, the bellows 164 expands and contracts. As a result, a distance between the susceptor 12 and the upper electrode 64 can be varied.

Moreover, in this plasma processing apparatus, the heating element 50 provided in the susceptor 12 is provided in an insulating sheet 181 disposed between the electrostatic chuck 32 and the high frequency electrode 30. Further, the upper electrode 64 is fastened to the top surface of the chamber 10 via a ring-shaped insulator 182. The high frequency power supply 34 configured to output a first high frequency power HF for plasma generation is electrically connected to the upper electrode 64 via the upper matching unit 184 and the upper power feed rod 186. Further, the high frequency power supply 36 configured to output a second high frequency power LF for ion attraction is electrically connected to the susceptor 12 via a matcher (not shown) within the lower matching unit 38 and the lower power feed rod 40.

The present example embodiment may not be limited to the capacitively coupled plasma etching apparatus but can be applied to various types of plasma etching apparatuses such as a microwave plasma etching apparatus, an inductively coupled plasma etching apparatus, a helicon wave plasma etching apparatus, etc. and, also, can be applied to other plasma processing apparatuses such as a plasma CVD apparatus, a plasma oxidizing apparatus, a plasma nitriding apparatus, a sputtering apparatus, etc. Further, the processing target substrate may not be limited to the semiconductor wafer but may be a photomask, a CD substrate, a printed substrate, or one of various types of substrates for a flat panel display, an organic EL and a solar cell.

In a plasma processing apparatus of a microwave discharging type, particularly, in a plasma etching apparatus of this type, a mounting table or susceptor configured to mount thereon a processing target substrate such as a semiconductor wafer within a chamber also has a substrate holding (chucking) function, a bias function, and a temperature control function, as in the aforementioned capacitively coupled plasma processing apparatus.

In particular, in a configuration where a heating element is embedded in the susceptor for temperature control, for example, a power having an AC frequency is applied to the heating element in the susceptor through a heater power feed line from a heater power supply provided at the outside of the chamber. Even in this case, a part of a high frequency bias power (for ion attraction) applied to a high frequency electrode of the susceptor may be easily introduced into the heater power feed line through the heating element. For this reason, a filter configured to attenuate or block a high frequency noise is provided on the heater power feed line. Thus, the above-described configuration of the filter units 54(IN) and 54(OUT) and the arrangement of the heater power feed lines 100(1) and 100(2) within and directly under the susceptor 12 can also be applied to the microwave plasma processing apparatus.

In the microwave plasma processing apparatus, a part of a microwave typically having a frequency of about 2.45 GHz for plasma generation which is radiated into the chamber from an antenna at a ceiling via a dielectric window may be introduced into the filter units 54(IN) and 54(OUT) after passing through plasma and the susceptor. In this case, if the microwave introduced into the filter units 54(IN) and 54(OUT) leaks out, it may cause radio noise.

FIG. 19A to FIG. 19D illustrate configuration examples capable of suppressing microwave leakage securely in the microwave plasma processing apparatus in which the filter unit 54(IN) is fastened to the bottom wall 10a of the chamber 10 in accordance with the example embodiment. The same goes for the filter unit 54(OUT).

Figure 19A:
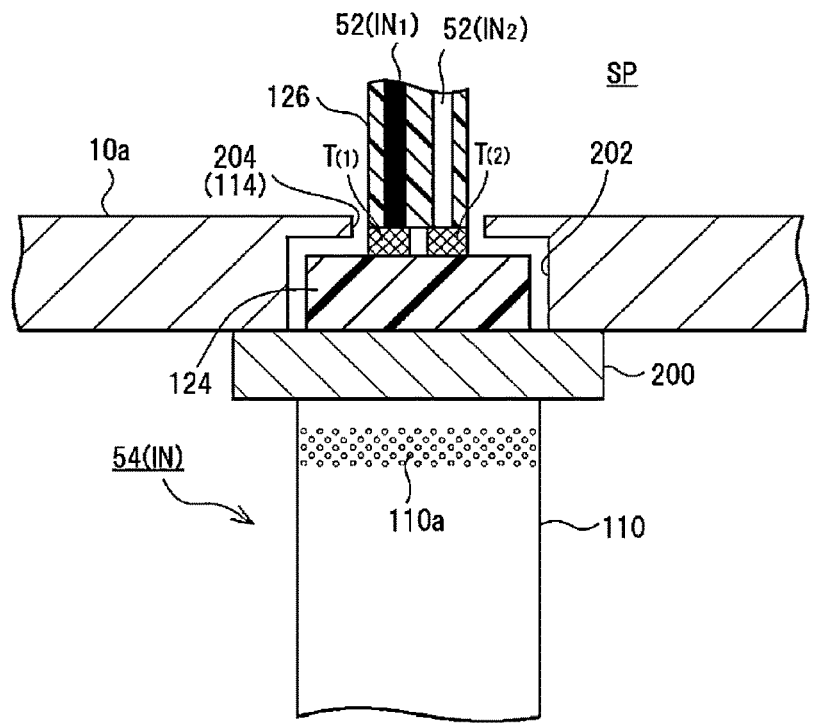
FIG. 19A is a cross sectional view illustrating an example of a filter unit mounting structure in a microwave plasma processing apparatus.

In a filter unit mounting structure depicted in FIG. 19A, a washer-shaped flange 200 made of a conductor, for example, aluminum is formed as one body with the casing 110 of a filer unit 54(IN) or fastened to an upper part of the casing 110, and a top surface of the flange 200 is firmly in contact with a base or a bottom surface of the bottom wall 10a of the chamber 10. A spot facing hole 202 configured to accommodate an upper connector 124 and an opening 204 configured to allow the insulating rod 126 incorporating pin-shaped power feed conductors 52(IN$_1$) and 52(IN$_2$) to pass therethrough are formed in the bottom wall 10a of the chamber 10. Further, air cooling ventilation holes 110a each having a diameter of, desirably, about 3 mm or less are formed in a lateral surface of the casing 110 by a punching process.

In this mounting structure, a gap, through which a microwave is leaked, does not substantially exist between the bottom wall 10a of the chamber 10 and the filter unit 54(IN). Thus, leakage of the microwave can be suppressed. Further, since the ventilation hole 110a of the casing 110 has a diameter of about 3 mm or less, the microwave may not be leaked through the ventilation holes 110a as well.

Figure 19B:
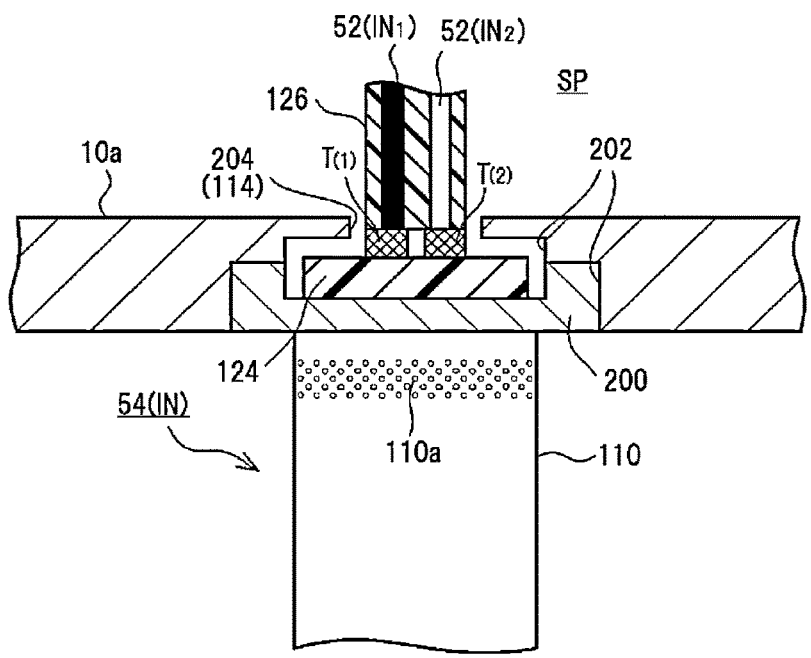
FIG. 19B is a cross sectional view illustrating another example of a filter unit mounting structure in the microwave plasma processing apparatus.

In a filter unit mounting structure depicted in FIG. 19B, a flange 200 is insertion-fitted from below into the spot facing hole 202 formed in the bottom wall 10a of the chamber 10. In this case, not only a top surface of the flange 200 but also a lateral surface thereof is firmly in contact with the bottom wall 10a of the chamber 10. In this mounting structure, since a gap, through which a microwave is leaked, does not substantially exist between the bottom wall 10a of the chamber 10 and the filter unit 54(IN), leakage of the microwave can be suppressed. Further, in this mounting structure, as the flange 200 formed as one body with the casing 110 or bonded to the casing 110 is insertion-fitted into the spot facing hole 202, the positions of filter terminals T$_{(1)}$ and T$_{(2)}$ are defined and power feed conductors 52(IN$_1$) and 52(IN$_2$) can be positioned with respect to the socket terminal 128 (156) (FIG. 7 and FIG. 15) at the side of the susceptor 12.

Figure 19C:
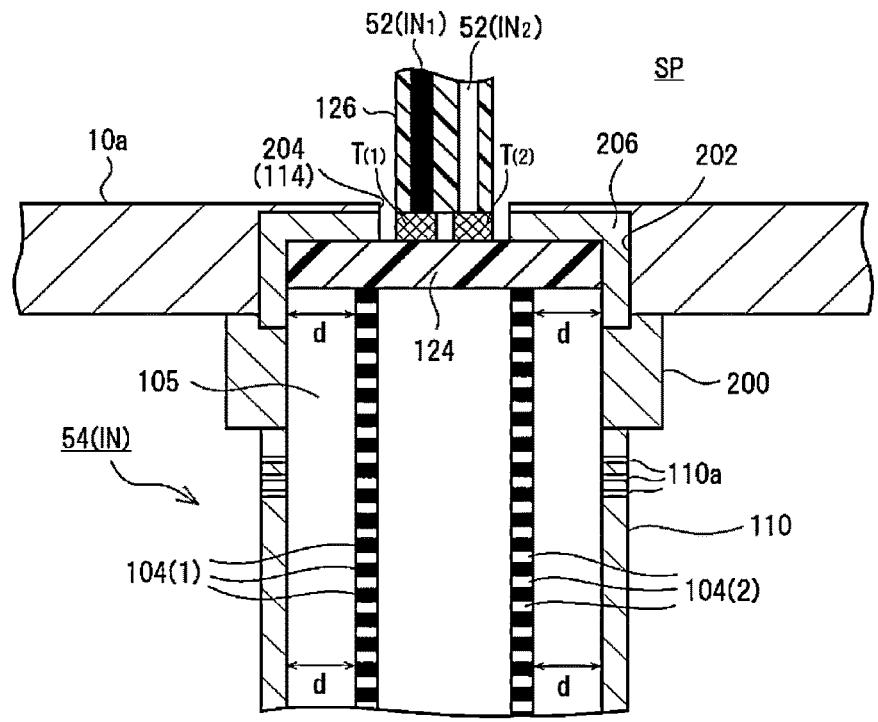
FIG. 19C is a cross sectional view illustrating still another of a filter unit mounting structure in the microwave plasma processing apparatus.
Figure 19D:
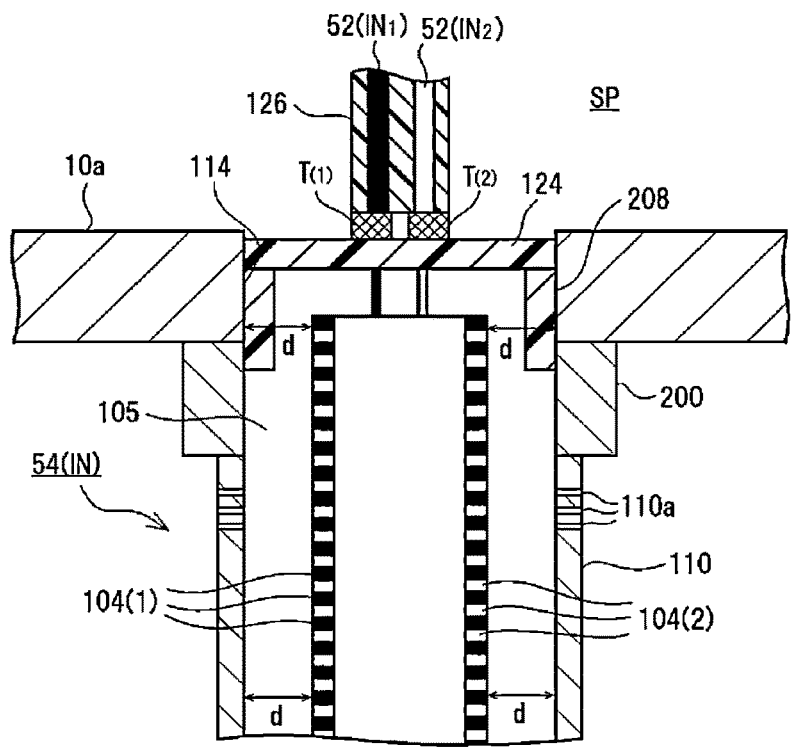
FIG. 19D is a cross sectional view illustrating still another example of a filter unit mounting structure in the microwave plasma processing apparatus.
Figure 19E:
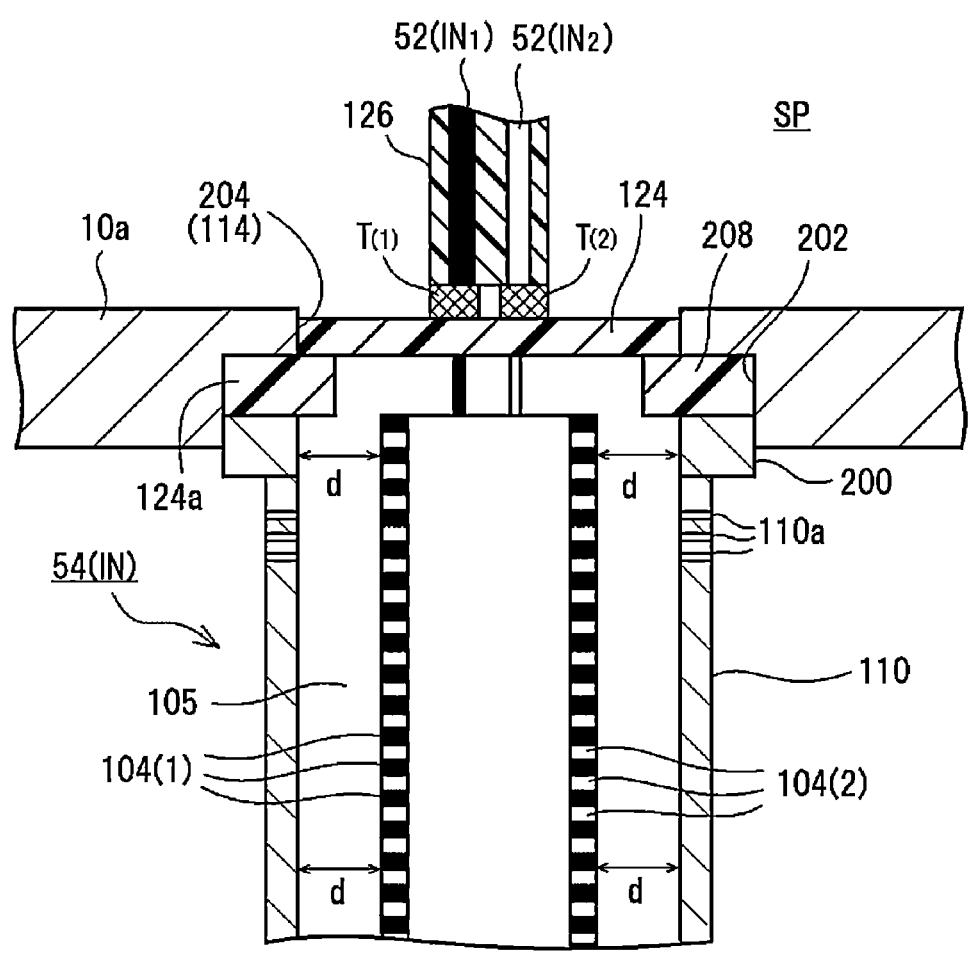
FIG. 19E is a cross sectional view illustrating still another example of a filter unit mounting structure in the microwave plasma processing apparatus.

FIG. 19C to FIG. 19E illustrate configuration examples for maintaining constant characteristic impedance of a distributed constant line 105 within the casing 110 in case of using the above-described filter unit mounting structures capable of suppressing leakage of a microwave.

As described above, in the configuration where the top surface of the flange 200 is firmly in contact with the base or the bottom surface of the bottom wall 10a of the chamber 10 (FIG. 19A), if upper ends of coils 104(1) and 104(2) protrude above the flange 200, not the casing 110 but an inner wall of the spot facing hole 202, which is formed in the bottom wall 10a of the chamber 10 and has a diameter larger than that of the casing 110, may serve as an outer conductor facing the protruded portions of the coils in a radial direction. Accordingly, the characteristic impedance of the distributed constant line (coaxial line) 105 may be disturbed.

Therefore, in a configuration example depicted in FIG. 19C, a cap-shaped spacer 206, which has an opened central portion and is made of a conductor, for example, aluminum, is inserted among the upper connector 124, the flange 200, and the spot facing hole 202 of the bottom wall 10a of the chamber 10. An inner surface of the spacer 206 and an inner surface of the flange 200 are arranged on the same plane as the inner surface of the casing 110. As a result, a constant distance d between the coils 104(1) and 104(2) and the outer conductor is maintained over the entire of the distributed constant line (coaxial line) 105. Further, the conductive spacer 206 functions as a shim configured to easily and accurately adjust the positions of the filter terminals T$_{(1)}$ and T$_{(2)}$ and the power feed conductors 52(IN$_1$) and 52(IN$_2$) with respect to the socket terminal 128 (156) (FIG. 7 and FIG. 15) at the side of the susceptor 12.

In a configuration example depicted in FIG. 19D, instead of providing the conductive spacer 206, the opening 114 is formed through the bottom wall 10a of the chamber 10 to have the same diameter as an inner diameter of the casing 110, and the inner wall of the opening 114 and the inner surface of the flange 200 are arranged on the same plane as the inner surface of the casing 110. As a result, a constant distance d between the coils 104(1) and 104(2) and the outer conductor is maintained. Further, in order to adjust the positions of the filter terminals T$_{(1)}$ and T$_{(2)}$ and the power feed conductors 52(IN$_1$) and 52(IN$_2$), a ring-shaped or cylinder-shaped flange portion 208, which is made of an insulator and is insertion-fitted into the opening 114 of the bottom wall 10a of the chamber 10, is formed as one body with or bonded to a bottom surface of the upper connector 124.

In a configuration example depicted in FIG. 19E, when a flange 200 at the side of the casing 110 is insertion-fitted into the opening 114 of the bottom wall 10a of the chamber 10 or the spot facing hole 202, the inner surface of the flange 200 is arranged on the same plane as the inner surface of the casing 110, facing the upper ends of the coils 104(1) and 104(2).

Figure 20A:
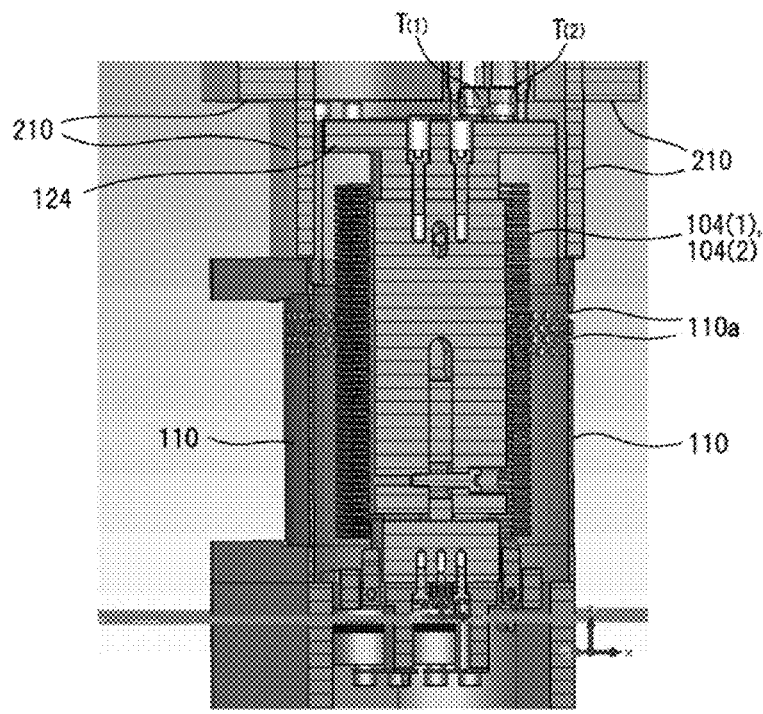
FIG. 20A is a cross sectional view illustrating a filter unit mounting structure in accordance with an experimental example used in an electromagnetic field simulation for investigating a microwave leakage.
Figure 20B:
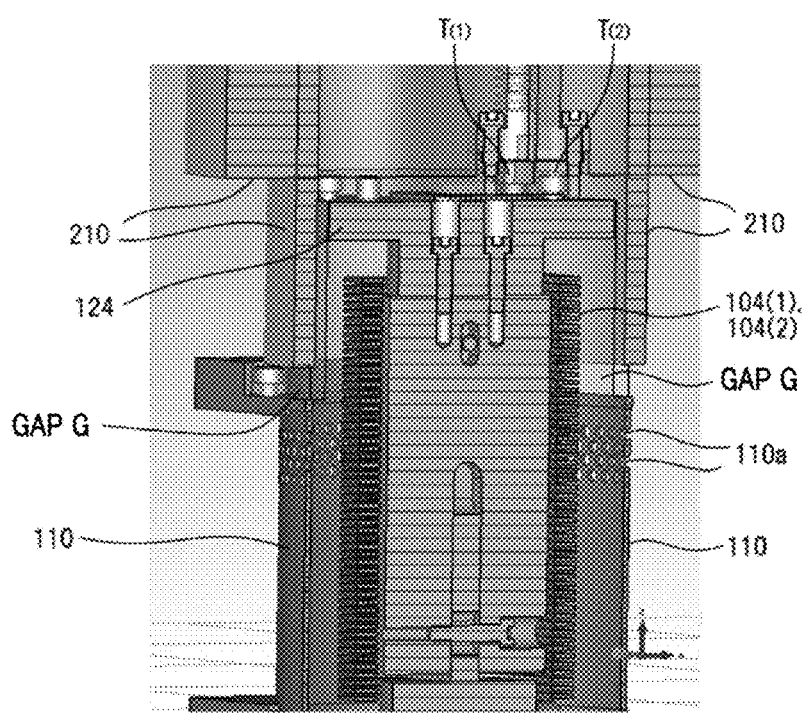
FIG. 20B is a cross sectional view illustrating a filter unit mounting structure in accordance with a comparative experimental example used in an electromagnetic field simulation for investigating a microwave leakage.

The present inventor has verified a microwave leakage phenomenon that occurs in the presence of a gap in the filter unit 54(IN) by the electromagnetic field simulation. In this simulation, instead of the opening 114 of the bottom wall 10a of the chamber 10, a cylinder-shaped cover body 210 made of aluminum is connected to the upper end of the casing 110. Here, a configuration in which no gap is provided between a lower end of the cover body 210 and the upper end of the casing 110 as depicted in FIG. 20A is set as an experimental example, and a configuration in which a gap G is formed therebetween as depicted in FIG. 20B is set as a comparative experimental example. The gap G is about 8 mm high (height) and about 60 mm wide (width).

Figure 21A:
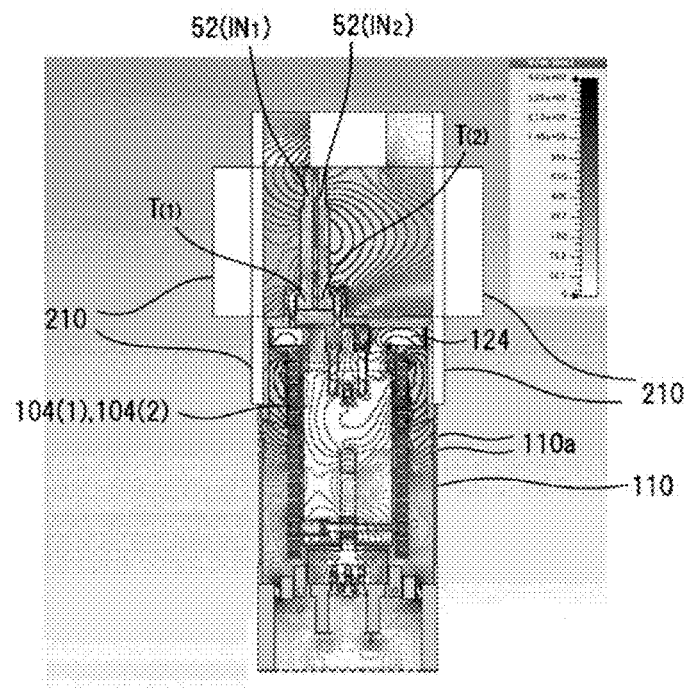
FIG. 21A is a diagram showing a result of the electromagnetic field simulation in the example embodiment.
Figure 21B:
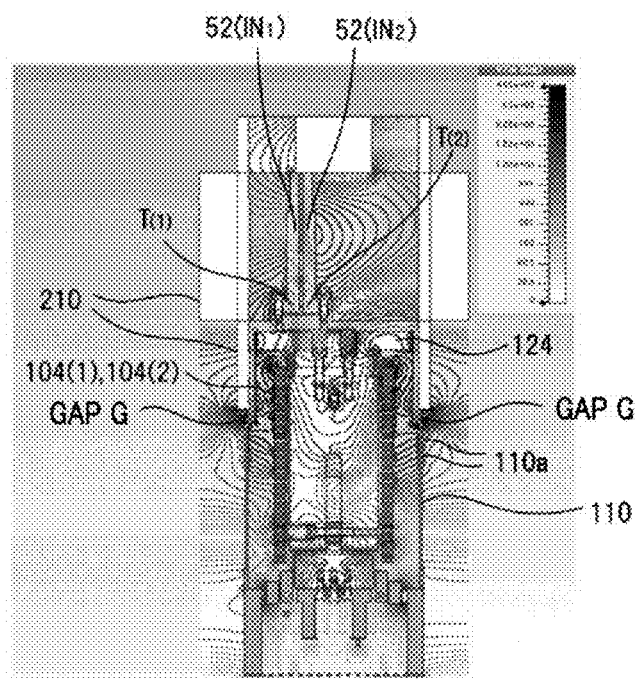
FIG. 21B is a diagram showing a result of the electromagnetic field simulation in the comparative experimental example.

In case where a microwave of about 2.45 GHz is introduced into the filter unit 54(IN) from above, an electric field distribution within and around the casing 110 has been obtained by the electromagnetic field simulation. In the experimental example (FIG. 20A), microwave leakage is not observed at all, as depicted in FIG. 21A. Further, no leakage through the ventilation holes (punching metal) 110a of the casing 110 is observed, either. Meanwhile, in the comparative experimental example (FIG. 20B), it is found out that a great amount of microwave is leaked through the gap G, as depicted in FIG. 21B.

Further, the present inventor has also investigated whether an electromagnetic field leakage has occurred for a high frequency power of 100 MHz in the filter unit mounting structures of the experimental example (FIG. 20A) and the comparative experimental example (FIG. 20B) by electromagnetic field simulation as in the above case. As a result of the simulation, though illustration is omitted, no leakage of electromagnetic field occurs both in the experimental example (FIG. 20A) and the comparative experimental example (FIG. 20B).

Typically, it is commonly known that when an electromagnetic wave (a traveling wave) reaches an opening portion of a conductor, if a half-wavelength of the electromagnetic wave is smaller than the maximum opening width of the opening portion, the electromagnetic wave cannot pass through the opening portion. In the comparative experimental example (FIG. 20B), a half-wavelength of the microwave (2.45 GHz) is about 61 mm and a size of the gap G formed at the upper end of the filter unit 54(IN) is about 8 mm×60 mm. Thus, according to the above-stated common view, the microwave of about 2.45 GHz can narrowly pass through the gap G, and the simulation result substantially coincides with this expectation.

Therefore, when a gap is inevitably formed between the filter unit 54(IN) and the chamber 10 for the reasons of design of the filter unit 54(IN) and/or the chamber 10, if the maximum opening width of the gap is set to be about equal to or less than a half of the half-wavelength of the microwave (about 30 mm or less), leakage of the microwave could be suppressed, according to the above common view.

The present inventor has conducted simulations to verify the above. That is, the present inventor has prepared a mounting structure having a gap based on the comparative experimental example (FIG. 20B). That is, a circular hole (gap) G is formed between the cover body 210 and the casing 110, and the diameter of the circular hole G is set to be about 13 mm, about 17 mm, about 23 mm, about 27 mm, and about 35 mm, in five steps. Then, an electric field distribution in and around the casing 110, when a microwave of about 2.45 GHz is introduced into the filter unit 54(IN) from above, is calculated for each step by electromagnetic field simulation. FIGS. 22A to 22E show the simulation results.

Figure 22A:
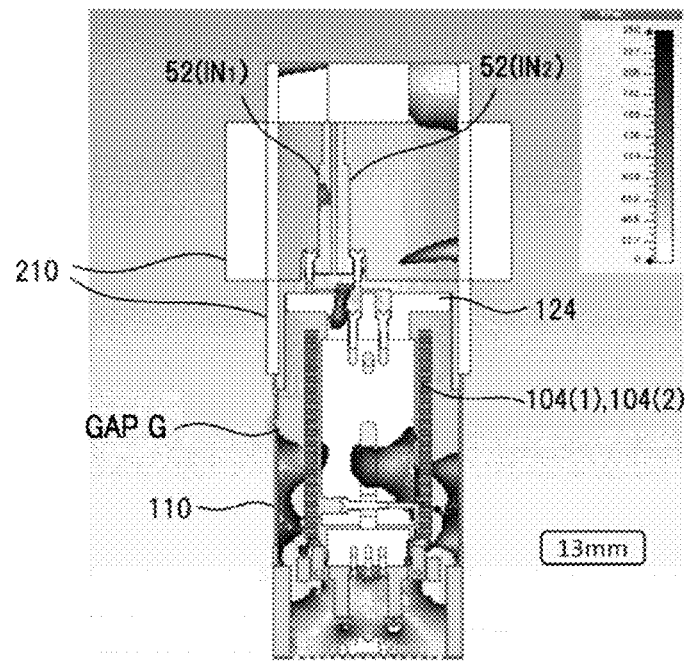
FIG. 22A is a diagram showing a result of the electromagnetic field simulation in a case that a circular hole having a diameter of about 13 mm is formed between a cover body and a casing in the filter unit mounting structure of FIG. 20A.
Figure 22B:
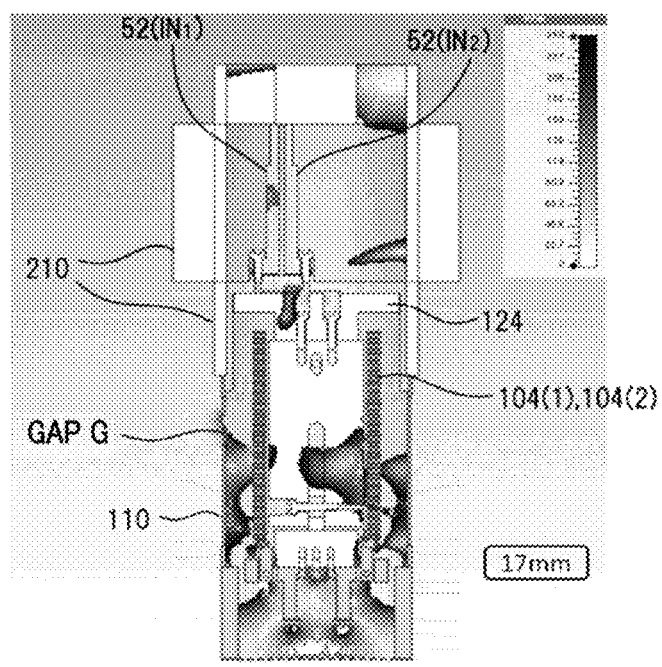
FIG. 22B is a diagram showing a result of an electromagnetic system simulation in a case that a circular hole having a diameter of about 17 mm is formed in the filter unit mounting structure of FIG. 20A.
Figure 22C:
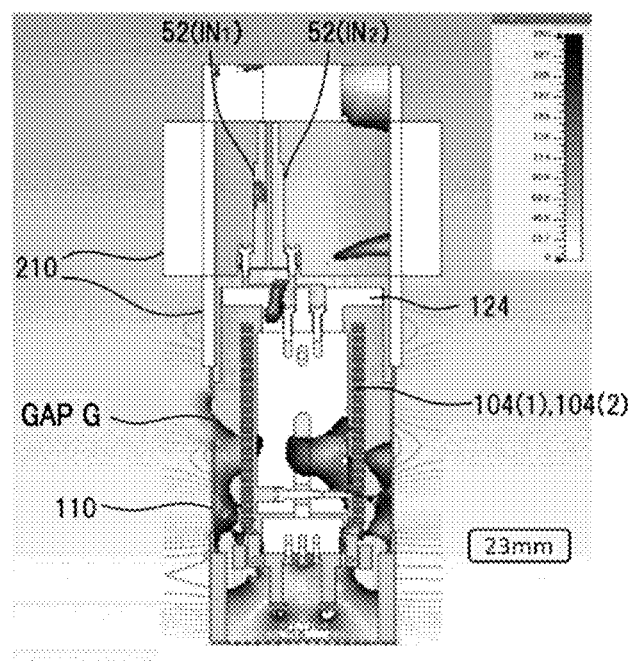
FIG. 22C is a diagram showing a result of an electromagnetic system simulation in a case that a circular hole having a diameter of about 23 mm is formed in the filter unit mounting structure of FIG. 20A.
Figure 22D:
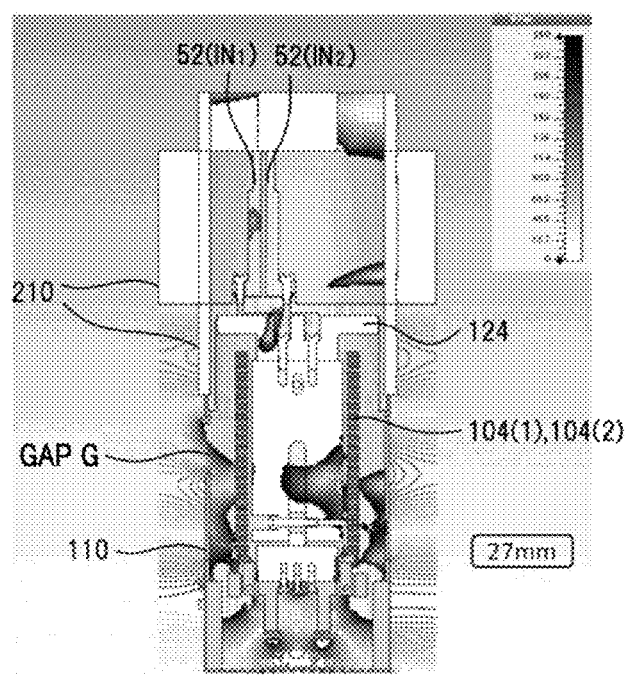
FIG. 22D is a diagram showing a result of an electromagnetic system simulation in a case that a circular hole having a diameter of about 27 mm is formed in the filter unit mounting structure of FIG. 20A.
Figure 22E:
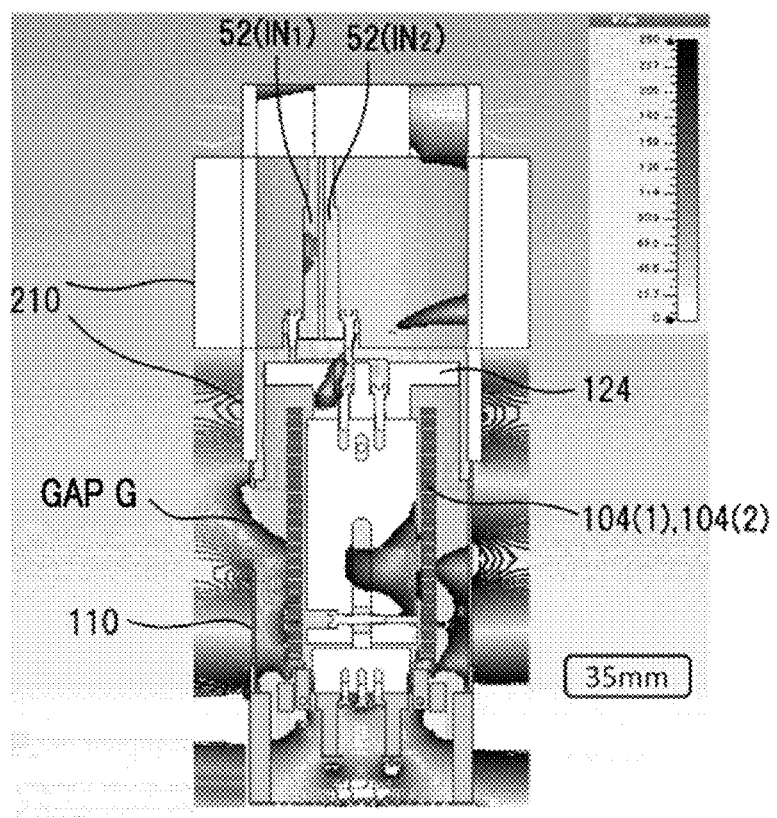
FIG. 22E is a diagram showing a result of an electromagnetic system simulation in a case that a circular hole having a diameter of about 35 mm is formed in the filter unit mounting structure of FIG. 20A.

As shown in FIG. 22A, when the circular hole G has a diameter of about 13 mm, it is found out that an electric field (microwave) leakage of about several V/m occurs. As the diameter of the circular hole G increases to about 17 mm, about 23 mm, and 27 mm, a leakage amount of the electric field (microwave) also increases (FIGS. 22B, 22C, and 22D). When the diameter of the circular hole G is about 35 mm, it can be seen that the electric field (microwave) in an amount of about 100 V/m or more leaks (FIG. 22E).

As can be seen from the above-described simulations, in order to securely suppress a microwave leakage around the mounting structure for the filter unit 54(IN) in the microwave plasma processing apparatus to which the present embodiment is applied, it may not be sufficient to set the maximum opening width of the gap between the filter unit 54(IN) and the chamber 10 to be the half-wavelength (about 60 mm) of the microwave or a half of the half-wavelength (about 30 mm). The simulations indicate that the maximum opening width of the gap needs to be set to be equal to or less than one several tenth of the half-wavelength (about 3 mm or less).

I claim:

1. A plasma processing apparatus, comprising:
a processing vessel in which a plasma process is performed;
a mounting table disposed on a plate-shaped conductive base with a space therebetween within the processing vessel and configured to mount and hold thereon a processing target substrate;
a high frequency electrode provided in the mounting table;
a high frequency power feed unit configured to apply a high frequency power of a predetermined frequency to the high frequency electrode;
a heating element provided in the mounting table;
a heater power feed line configured to electrically connect the heating element to a heater power supply disposed at an outside of the processing vessel; and
a filter unit having a coil configured to attenuate or block a high frequency noise introduced to the heater power feed line through the heating element, and a casing accommodating therein the coil,
wherein the filter unit is placed such that an upper end of the casing is arranged at a position equal to or lower than a top surface of the base directly under the mounting table,
an opening, through which the heater power feed line passes without being contacted thereto, is formed in the base,
the heater power feed line includes a pin-shaped or rod-shaped first conductor extended from a first terminal of the coil located inside or under the opening of the base to a bottom surface of the mounting table through the space, and
an uppermost surface of the first terminal of the coil is located on the same plane as the top surface of the base.

2. The plasma processing apparatus of claim 1,
wherein the first conductor is extended within the space or within the opening straightly without being bent.

3. The plasma processing apparatus of claim 2,
wherein the first conductor is extended within the space or within the opening straightly in a vertical direction.

4. The plasma processing apparatus of claim 1,
wherein the first conductor is embedded in an insulating rod, and the insulating rod is not in contact with an inner surface of the opening formed in the base.

5. The plasma processing apparatus of claim 1,
wherein the first terminal of the coil is exposed.

6. The plasma processing apparatus of claim 1,
wherein the uppermost surface of the first terminal of the coil faces the space in an open state without being shielded.

7. The plasma processing apparatus of claim 1,
wherein the heater power feed line comprises:
a socket terminal that is provided on the bottom surface of the mounting table and is configured to allow an upper end of the first conductor to be inserted therein; and
a pin-shaped, rod-shaped or plate-shaped second conductor that is extended within the mounting table and is configured to allow the socket terminal to be electrically connected to a terminal of the heating element.

8. The plasma processing apparatus of claim 7,
wherein the first terminal of the coil and the socket terminal are positioned closer to a central portion of the processing vessel than the terminal of the heating element.

9. The plasma processing apparatus of claim 7,
wherein the mounting table includes a conductive backplate, and a top surface of the backplate is contacted with a bottom surface of the high frequency electrode while a bottom surface thereof faces the space, and the second conductor has a section extended in a horizontal direction within an insulator embedded in the backplate.

10. The plasma processing apparatus of claim 7,
wherein the mounting table includes an insulating backplate, and a top surface of the backplate is contacted with a bottom surface of the high frequency electrode while a bottom surface thereof faces the space, and the second conductor is extended in a horizontal direction within a groove formed in the bottom surface of the high frequency electrode.

11. The plasma processing apparatus of claim 1,
wherein the mounting table comprises an electrostatic chuck, and the electrostatic chuck includes:

a dielectric layer of which a bottom surface is contacted with a top surface of the high frequency electrode while a top surface thereof serves as a mounting surface configured to mount the substrate thereon; and a DC electrode embedded in the dielectric layer and to which a high DC voltage is applied in order to attract the substrate.

12. The plasma processing apparatus of claim 11,
wherein the heating element is provided within the dielectric layer to be located lower than the DC electrode.

13. The plasma processing apparatus of claim 11,
wherein the heating element is provided in an insulating sheet disposed between the electrostatic chuck and the high frequency electrode.

14. The plasma processing apparatus of claim 1,
wherein the mounting table is provided on the base via a cylindrical supporting member made of a dielectric material.

15. The plasma processing apparatus of claim 1,
wherein the base serves as a bottom wall of the processing vessel.

16. The plasma processing apparatus of claim 1,
wherein the base is configured to be movable or displacable up and down above a bottom wall of the processing vessel, and the filter unit is positioned between the base and the bottom wall of the processing vessel.

17. The plasma processing apparatus of claim 1,
wherein the base is electrically grounded.

18. The plasma processing apparatus of claim 1,
wherein the casing of the filter unit is made of a conductor and is electrically grounded.

19. The plasma processing apparatus of claim 1,
wherein the filter unit includes a capacitor electrically connected between a second terminal of the coil and a member having a ground potential.

* * * * *